(12) United States Patent
Sakamoto et al.

(10) Patent No.: US 8,803,784 B2
(45) Date of Patent: Aug. 12, 2014

(54) SCANNING SIGNAL LINE DRIVE CIRCUIT AND DISPLAY DEVICE HAVING THE SAME

(75) Inventors: Mayuko Sakamoto, Osaka (JP); Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 174 days.

(21) Appl. No.: 13/379,556

(22) PCT Filed: Feb. 17, 2010

(86) PCT No.: PCT/JP2010/052329
§ 371 (c)(1),
(2), (4) Date: Dec. 20, 2011

(87) PCT Pub. No.: WO2011/007591
PCT Pub. Date: Jan. 20, 2011

(65) Prior Publication Data
US 2012/0105396 A1    May 3, 2012

(30) Foreign Application Priority Data

Jul. 15, 2009  (JP) .................................. 2009-166305
Nov. 26, 2009  (JP) .................................. 2009-268410

(51) Int. Cl.
*G09G 3/36* (2006.01)
(52) U.S. Cl.
USPC ............... 345/100; 345/92; 345/96; 345/204; 377/69; 377/78; 377/79
(58) Field of Classification Search
USPC ............. 345/100, 204, 99, 96, 92; 377/64–81
See application file for complete search history.

(56) References Cited

U.S. PATENT DOCUMENTS

| | | | | |
|---|---|---|---|---|
| 4,562,435 | A * | 12/1985 | McDonough et al. | 345/545 |
| 5,136,622 | A * | 8/1992 | Plus | 377/64 |
| 5,365,284 | A * | 11/1994 | Matsumoto et al. | 348/793 |
| 5,986,630 | A | 11/1999 | Hirakata et al. | |
| 7,215,309 | B2 * | 5/2007 | Yamato et al. | 345/100 |
| 7,777,698 | B2 * | 8/2010 | Takahara et al. | 345/76 |
| 8,121,244 | B2 * | 2/2012 | Kim | 377/64 |
| 8,134,529 | B2 * | 3/2012 | Kim et al. | 345/98 |
| 8,159,446 | B2 * | 4/2012 | Lee et al. | 345/100 |
| 8,179,355 | B2 * | 5/2012 | Lee et al. | 345/99 |

(Continued)

FOREIGN PATENT DOCUMENTS

| | | |
|---|---|---|
| CN | 101354514 | 1/2009 |
| EP | 1 667 092 | 6/2006 |

(Continued)

*Primary Examiner* — Lun-Yi Lao
*Assistant Examiner* — Kelly B Hegarty
(74) *Attorney, Agent, or Firm* — Harness, Dickey & Pierce, P.L.C.

(57) ABSTRACT

A gate driver is provided with an odd-numbered stage shift register, an even-numbered stage shift register, and main lines including clock signal main lines. In at least one example embodiment, each stage of one of the shift registers receives the first clock and the second clock from the clock signal main lines, and the third clock and the fourth clock from an adjacently provided stage of the other shift register. Each stage of the shift register can receive the second clock from a different stage of the same shift register. With this, it is possible to reduce a picture-frame area of a panel in a display device provided with a scanning signal line drive circuit having the plurality of shift registers.

9 Claims, 22 Drawing Sheets

(56) References Cited

U.S. PATENT DOCUMENTS

| | | | |
|---|---|---|---|
| 8,238,512 B2* | 8/2012 | Kim | 377/64 |
| 8,253,680 B2* | 8/2012 | Jang et al. | 345/100 |
| 8,284,150 B2* | 10/2012 | Han | 345/100 |
| 8,344,989 B2* | 1/2013 | Kim | 345/100 |
| 2003/0227433 A1 | 12/2003 | Moon | |
| 2004/0160432 A1* | 8/2004 | Kubota et al. | 345/204 |
| 2006/0022201 A1 | 2/2006 | Kim et al. | |
| 2006/0061562 A1 | 3/2006 | Park et al. | |
| 2006/0145998 A1* | 7/2006 | Cho et al. | 345/100 |
| 2006/0210012 A1* | 9/2006 | Yamaguchi et al. | 377/64 |
| 2006/0221042 A1* | 10/2006 | Cho et al. | 345/100 |
| 2006/0274021 A1* | 12/2006 | Park et al. | 345/100 |
| 2007/0001991 A1* | 1/2007 | Jang et al. | 345/100 |
| 2007/0085809 A1 | 4/2007 | Wei et al. | |
| 2007/0171179 A1 | 7/2007 | Morosawa | |
| 2007/0183218 A1* | 8/2007 | Lee et al. | 365/185.26 |
| 2008/0018572 A1 | 1/2008 | Shin et al. | |
| 2008/0067511 A1 | 3/2008 | Kim | |
| 2008/0079685 A1* | 4/2008 | Umezaki et al. | 345/100 |
| 2008/0211760 A1 | 9/2008 | Baek et al. | |
| 2008/0231616 A1* | 9/2008 | Kim et al. | 345/204 |
| 2009/0026452 A1 | 1/2009 | Miyaguchi et al. | |
| 2009/0122951 A1* | 5/2009 | Tobita | 377/68 |
| 2009/0167668 A1* | 7/2009 | Kim | 345/100 |
| 2009/0213982 A1* | 8/2009 | Peng et al. | 377/79 |
| 2010/0007598 A1* | 1/2010 | Chan et al. | 345/100 |
| 2010/0158187 A1* | 6/2010 | Moon et al. | 377/76 |
| 2010/0245337 A1* | 9/2010 | Hu et al. | 345/213 |
| 2010/0302217 A1* | 12/2010 | Ochiai et al. | 345/204 |
| 2011/0002438 A1* | 1/2011 | Kim | 377/67 |
| 2013/0063331 A1* | 3/2013 | Kim et al. | 345/100 |

FOREIGN PATENT DOCUMENTS

| | | |
|---|---|---|
| JP | 2004157508 A | 6/2004 |
| JP | 2004287448 A | 10/2004 |
| JP | 2006039524 A | 2/2006 |
| JP | 2007-114761 | 5/2007 |
| JP | 2007200452 A | 8/2007 |
| JP | 2007316642 A | 12/2007 |
| JP | 200826865 A | 2/2008 |
| JP | 2008146079 A | 6/2008 |
| JP | 2009134814 A | 6/2009 |
| WO | WO-03/087921 A2 | 10/2003 |

* cited by examiner

THIS EMBODIMENT
MAIN LINES

CONVENTIONAL
MAIN LINES

L

SCANNING SIGNAL LINE DRIVE CIRCUIT AND DISPLAY DEVICE HAVING THE SAME

TECHNICAL FIELD

The present invention relates to a scanning signal line drive circuit of an active matrix-type display device, and in particular to a shift register included in a scanning signal line drive circuit.

BACKGROUND ART

Conventionally, there is known an active matrix-type display device, in which a plurality of gate bus lines (scanning signal lines) and a plurality of source bus lines (video signal lines) are provided in a grid pattern, and a plurality of pixel formation portions are provided in matrix corresponding to respective intersection points between the signal lines. Each pixel formation portion includes a thin film transistor (Thin Film Transistor: TFT) as a switching device and a pixel capacitance for holding a pixel value. A gate terminal of the thin film transistor is connected to the gate bus line that passes the corresponding intersection point, and a source terminal of the thin film transistor is connected to the source bus line that passes the same intersection point. The active matrix-type display device is further provided with a gate driver (scanning signal line drive circuit) that drives the gate bus lines and a source driver (video signal line drive circuit) that drives the source bus lines.

Video signals indicating the pixel values are transmitted through the source bus lines, but a single source bus line cannot transmit video signals indicating the pixel values of more than one row at the same time (simultaneously). Accordingly, the video signals are written to the pixel capacitances included in the pixel formation portions sequentially by row. Thus, a gate driver including a shift register having a plurality of stages is used to sequentially select the plurality of gate bus lines for a predetermined time period.

The shift register operates based on clock signals. The clock signals are supplied to each stage of the shift register from clock signal main lines provided on an outer rim of a panel. Further, the clock signals are typically supplied to a plurality of thin film transistors included in the shift register. Accordingly, an area for laying out the shift register is required between an area for providing the clock signal main lines and an area for providing the pixel formation portions. This constitutes one reason of an increase of the area for laying out the shift register. In particular, in a case of a display device having a shift register that operates based on a large number of clock signals, an increase of a picture-frame area of the panel becomes problematic. Further, in a case in which a plurality of panels cut out from a mother glass have a relatively narrow area that can be used as a picture-frame area (small or medium size panel, for example), it becomes difficult to form a shift register in a picture-frame area. This produces a useless area in a panel, and a yield ratio is markedly reduced.

It should be noted that prior art documents as listed below are known relating to the present invention. Patent Documents 1 to 7 disclose a structure of a gate driver including a shift register. According to these documents, clock signals necessary for an operation of the shift register are supplied to each stage of the shift register from clock signal main lines as shown in FIG. 26. For example, as shown in FIG. 27, Patent Document 1 discloses decreasing an interval between signal lines of agate driving unit by providing contacts (square boxes with diagonal lines) and zigzag leading lines to connect between main lines and each stage of the gate driving unit. Further, Patent Document 7 discloses connecting clock leading lines from the clock signal main lines to two adjacent stages in a single shift register, and that the clock signals are shared by the two stages (see FIGS. 4 and 6 of Patent Document 7). The same structure is also disclosed in Patent Document 6 (see FIGS. 3 and 5 of Patent Document 6). According to Patent Documents 6 and 7, the number of types of the clock signals required for the operation of the shift register is two (CK1 and CK2), and the number of clock leading lines is one for each stage of the shift register.

PRIOR ART DOCUMENTS

Patent Documents

[Patent Document 1] Japanese Laid-Open Patent Publication No. 2008-26865
[Patent Document 2] Japanese Laid-Open Patent Publication No. 2004-157508
[Patent Document 3] International Publication Pamphlet No. WO 2003/87921
[Patent Document 4] Japanese Laid-Open Patent Publication No. 2008-146079
[Patent Document 5] Japanese Laid-Open Patent Publication No. 2007-200452
[Patent Document 6] Japanese Laid-Open Patent Publication No. 2006-39524
[Patent Document 7] Japanese Laid-Open Patent Publication No. 2007-316642

SUMMARY OF THE INVENTION

Problems to be Solved by the Invention

In recent years, downsizing of panels has been increasingly demanded, and reduction of a picture-frame area is required. However, as described above, reduction of a picture-frame area of a panel is limited as an area for laying out the shift register increases according to the conventional structure. In this regard, Patent Document 1 discloses a structure of decreasing an interval between signal lines of a gate driving unit. In order to sufficiently protect the gate driving unit (gate driver), it is desirable that the gate driving unit be covered (concealed) by a liquid crystal panel sealing material. However, according to the structure disclosed by Patent Document 1, increasing the number of wire lines in the gate driving unit decreases an area for applying the sealing material, resulting in insufficient protection of the gate driving unit.

Patent Documents 6 and 7 disclose a structure of decreasing the number of clock leading lines to be smaller than the number of clocks necessary for the operation of the shift register. These documents disclose a gate driving unit including a single shift register. However, it is difficult to drive a large size liquid crystal panel by a single shift register due to a large load, and two or more shift registers are required.

Thus, an object of the present invention is to reduce a picture-frame area of a panel in a display device provided with a scanning signal line drive circuit having a plurality of shift registers (for example, a display device having a large size panel)

Means for Solving the Problem

According to a first aspect of the present invention, there is provided a scanning signal line drive circuit capable of driving a plurality of scanning signal lines provided on a display unit of a display device, the scanning signal line drive circuit including: a plurality of shift registers each including a plurality of stages, and sequentially shifting a pulse supplied to a first stage based on a plurality of clock signals supplied to each stage to drive the scanning signal lines; and clock signal main lines including a plurality of signal lines respectively transmitting the clock signals, and provided on an opposite side of the display unit with respect to the shift registers, wherein each stage of the shift register receives a part of the clock signals from the clock signal main line, and a remaining part of the clock signals from another one of the shift registers.

According to a second aspect of the present invention, in the first aspect of the present invention, each stage of the shift register operates based on four clock signals.

According to a third aspect of the present invention, in the first aspect of the present invention, each stage of the shift register receives the remaining part of the clock signals from an adjacently provided stage of the other shift register.

According to a fourth aspect of the present invention, in the first aspect of the present invention, each stage of the shift register includes a charge control switching device configured to charge a corresponding one of the scanning signal lines based on the clock signal received from the clock signal main line, and a phase of the remaining part of the clock signals is displaced by 90 degrees from a phase of the clock signal supplied to the charge control switching device.

According to a fifth aspect of the present invention, in the first aspect of the present invention, each stage of the shift register includes a contact for supplying the part of the clock signals to both of a preceding-side and a succeeding-side stage of the other shift register.

According to a sixth aspect of the present invention, in the first aspect of the present invention, each stage of the shift register includes a contact for supplying the part of the clock signals to a preceding-side stage of the other shift register and a contact for supplying the part of the clock signals to a succeeding-side stage of the other shift register, the two contacts being provided at positions adjacent to each other.

According to a seventh aspect of the present invention, in the first aspect of the present invention, the plurality of the shift registers include a shift register having a dummy stage configured to supply the clock signal received from the clock signal main line to the first stage without change, and a shift register having a dummy stage configured to supply the clock signal received from the clock signal main line to a last stage without change.

According to an eighth aspect of the present invention, in the seventh aspect of the present invention, the dummy stage is configured only by a component necessary for transmitting the clock signal received from the clock signal main line, out of components of each stage of the shift register.

According to a ninth aspect of the present invention, there is provided a display device including: a display unit including a plurality of scanning signal lines; and the scanning signal line drive circuit according to one of the first to eighth aspects of the present invention.

According to a tenth aspect of the present invention, there is provided a scanning signal line drive circuit capable of driving a plurality of scanning signal lines provided on a display unit of a display device, the scanning signal line drive circuit including: a plurality of shift registers each including a plurality of stages, and sequentially shifting a pulse supplied to a first stage based on a plurality of clock signals supplied to each stage to drive the scanning signal lines; and clock signal main lines including a plurality of signal lines respectively transmitting the clock signals, and provided on an opposite side of the display unit with respect to the shift registers, wherein each stage of the shift register receives a part of the clock signals from the clock signal main line, a different part of the clock signals from another one of the shift registers, and a remaining part of the clock signals from a different stage of the same shift register.

According to an eleventh aspect of the present invention, in the tenth aspect of the present invention, each stage of the shift register operates based on four clock signals.

According to a twelfth aspect of the present invention, in the tenth aspect of the present invention, each stage of the shift register receives the different part of the clock signals from an adjacently provided stage of the other shift register, and the remaining part of the clock signals from one of a preceding stage and a succeeding stage of the same shift register.

According to a thirteenth aspect of the present invention, in the tenth aspect of the present invention, each stage of the shift register includes a charge control switching device configured to charge a corresponding one of the scanning signal lines based on the clock signal received from the clock signal main line, and a phase of the different part of the clock signals and a phase of the remaining part of the clock signals are displaced respectively by 90 degrees and 180 degrees from a phase of the clock signal supplied to the charge control switching device.

According to a fourteenth aspect of the present invention, in the tenth aspect of the present invention, each stage of the shift register includes a contact for supplying the part of the clock signals to at least two of a preceding-side stage of the other shift register, a succeeding-side stage of the other shift register, and a different stage of the same shift register.

According to a fifteenth aspect of the present invention, in the tenth aspect of the present invention, each stage of the shift register includes a contact for supplying the part of the clock signals to a preceding-side stage of the other shift register, a contact for supplying the part of the clock signals to a succeeding-side stage of the other shift register, and a contact for supplying the part of the clock signals to a different stage of the same shift register, at least two of the three contacts being provided at positions adjacent to each other.

According to a sixteenth aspect of the present invention, in the tenth aspect of the present invention, the plurality of the shift registers include a shift register having a dummy stage configured to supply the clock signal received from the clock signal main line to the first stage without change, and a shift register having a dummy stage configured to supply the clock signal received from the clock signal main line to a last stage without change.

According to a seventeenth aspect of the present invention, in the sixteenth aspect of the present invention, the dummy stage is configured only by a component necessary for transmitting the clock signal received from the clock signal main line, out of components of each stage of the shift register.

According to an eighteenth aspect of the present invention, there is provided a display device including: a display unit including a plurality of scanning signal lines; and the scanning signal line drive circuit according to one of the tenth to seventeenth aspects of the present invention.

Effects of the Invention

According to the first or tenth aspect of the present invention, the number of wire lines connecting between the clock signal main lines and each stage of the shift register decreases as compared to the conventional example. Accordingly, an area for the clock signal lines in each stage of the shift register becomes smaller. Further, as a load capacitance per one of the clock signal main lines becomes smaller as compared to the conventional example, it is possible to suppress mutual interference between the clock signals, and to reduce waveform rounding in the clock signals. Therefore, as compared to the conventional example, it is possible to downsize switching devices (for example, thin film transistors) that constitute the shift register. Moreover, it is not necessary to newly provide the shift registers with a component other than the signal lines for transmitting the clock signals between each stage of the shift register and the other shift register (or a different stage of the same shift register). As a result, it is possible to reduce a layout area for the shift registers on the panel of the display device, thereby reducing a picture-frame area of the panel.

According to the second or eleventh aspect of the present invention, the scanning signal line drive circuit provided with the shift registers operating based on the four clock signals provides the same effect as that of the first or tenth aspect.

According to the third or twelfth aspect of the present invention, it is possible to supply the clock signals to each stage of the shift register from a portion other than the clock signal main lines using relatively short signal lines. Accordingly, it is possible to achieve the scanning signal line drive circuit providing the same effect as that of the first or tenth aspect with a relatively simple configuration.

According to the fourth or thirteenth aspect of the present invention, the scanning signal line drive circuit provided with the shift registers operating based on the plurality of clock signals whose phases are displaced by 90 degrees to each other provides the same effect as that of the first or tenth aspect.

According to the fifth or fourteenth aspect of the present invention, configuring a part or all of the necessary contacts by a single contact reduces an area occupied by the contacts in each stage of the shift registers, and whereby the picture-frame area of the panel can be effectively reduced.

According to the sixth or fifteenth aspect of the present invention, it is possible to reduce a contact resistance as compared to a case in which the plurality of contacts are provided at distant positions.

According to the seventh, eighth, sixteenth, or seventeenth aspect of the present invention, as the stages of the shift registers have the same circuit configuration and parasitic capacitances become substantially equal, waveform rounding in the clock signals becomes substantially identical. This allows the shift registers to operate stably.

According to the ninth or eighteenth aspect of the present invention, it is possible to achieve the display device provided with the scanning signal line drive circuit providing the same effect as that of any of the first to eighth and the tenth to seventeenth aspects.

MODE FOR CARRYING OUT THE INVENTION

First Embodiment

Figure 1:
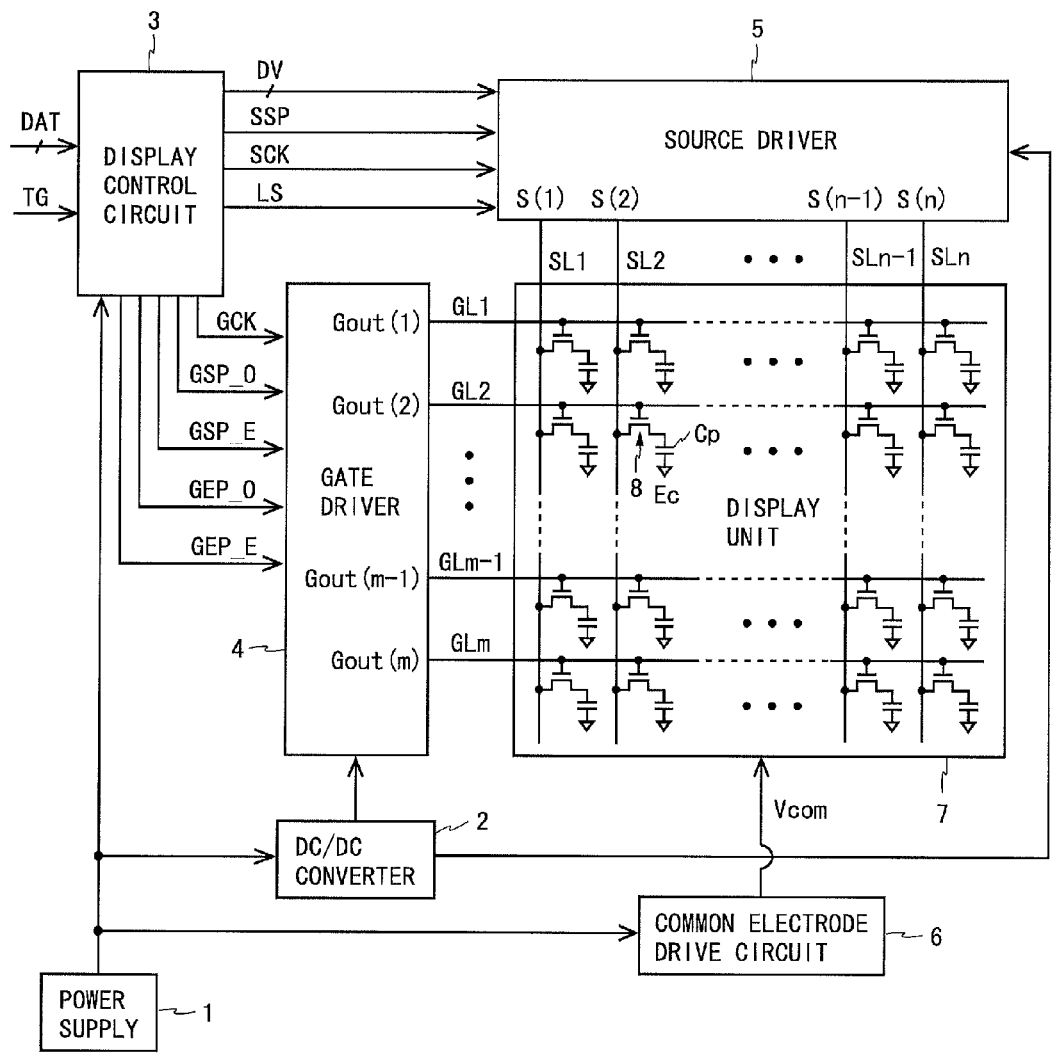
FIG. 1 is a block diagram illustrating a configuration of a liquid crystal display device according to a first embodiment of the present invention.

FIG. 1 is a block diagram illustrating a configuration of a liquid crystal display device according to a first embodiment of the present invention. The liquid crystal display device shown in FIG. 1 is an active matrix-type display device provided with a power supply 1, a DC/DC converter 2, a display control circuit 3, agate driver (scanning signal line drive circuit) 4, a source driver (video signal line drive circuit) 5, a common electrode drive circuit 6, and a display unit 7. Typically, the gate driver 4 and the display unit 7 are formed monolithically on the same substrate. The liquid crystal display device according to this embodiment is characterized in a configuration of a shift register included in the gate driver 4. In the following description, m is an even number, n is an integer not smaller than 2, and m=2a.

The display unit 7 includes m gate bus lines (scanning signal lines) GL1 to GLm, n source bus lines (video signal lines) SL1 to SLn, and (mxn) pixel formation portions provided corresponding to intersection points between these signal lines. The (mxn) pixel formation portions are provided in matrix and constitute a pixel array. Each pixel formation portion includes a thin film transistor 8 as a switching device, a pixel electrode, a common electrode Ec, and a liquid crystal layer. A gate terminal of the thin film transistor 8 is connected to one of the gate bus lines that passes the corresponding intersection point, a source terminal of the thin film transistor 8 is connected to one of the source bus lines that passes the same intersection point, and a drain terminal of the thin film transistor 8 is connected to the pixel electrode. The common electrode Ec is a counter electrode provided in common to the (mxn) pixel formation portions. The liquid crystal layer is sandwiched between the pixel electrode and the common electrode Ec. A pixel capacitance Cp is constituted by a liquid crystal capacitance formed by the pixel electrode and the common electrode Ec. It should be noted that many of the liquid crystal display devices are provided with an auxiliary capacitance in parallel with the liquid crystal capacitance, in order to reliably hold a voltage in the pixel capacitance Cp. The auxiliary capacitance is not directly related to the present invention, and therefore an explanation and an illustration of the auxiliary capacitance are omitted.

The power supply 1 supplies a predetermined power-supply voltage to the DC/DC converter 2, the display control circuit 3, and the common electrode drive circuit 6. The DC/DC converter 2 generates a predetermined direct-current voltage based on the power-supply voltage supplied from the power supply 1, and supplies the generated direct-current voltage to the gate driver 4 and the source driver 5. The common electrode drive circuit 6 supplies a predetermined potential Vcom to the common electrode Ec.

The display control circuit 3 receives an image signal DAT and a group of timing signals TG (including such as a horizontal synchronization signal and a vertical synchronization signal) that are externally supplied, and outputs a digital video signal DV and control signals for controlling display of an image in the display unit 7. The control signals outputted from the display control circuit 3 include a source start pulse signal SSP, a source clock signal SCK, a latch strobe signal LS, a first gate start pulse signal GSP_O, a second gate start pulse signal GSP_E, a first gate end pulse signal GEP_O, a second gate end pulse signal GEP_E, and gate clock signals GCK. The gate clock signals GCK includes clock signals CK1, CK1B, CK2, and CK2B of four phases (hereinafter referred to as first to fourth gate clock signals).

The gate driver 4 receives the first gate start pulse signal GSP_O, the second gate start pulse signal GSP_E, the first gate end pulse signal GEP_O, the second gate end pulse signal GEP_E, and the gate clock signals GCK outputted from the display control circuit 3. The gate driver 4 repeats, based on these signals, an operation of sequentially applying active scanning signals Gout(1) to Gout(m) to the gate bus lines GL1 to GLm taking one vertical scanning period as a single cycle.

The source driver 5 receives the digital video signal DV, the source start pulse signal SSP, the source clock signal SCK, and the latch strobe signal LS outputted from the display control circuit 3. The source driver 5 applies, based on these signals, driving video signals(1) to S(n) to the source bus lines SL1 to SLn.

By sequentially applying the active scanning signals Gout (1) to Gout(m) to the gate bus lines GL1 to GLm, and applying the driving video signals S(1) to S(n) to the source bus lines SL1 to SLn, an image based on the image signal DAT that has been externally supplied is displayed in the display unit 7.

Figure 2:
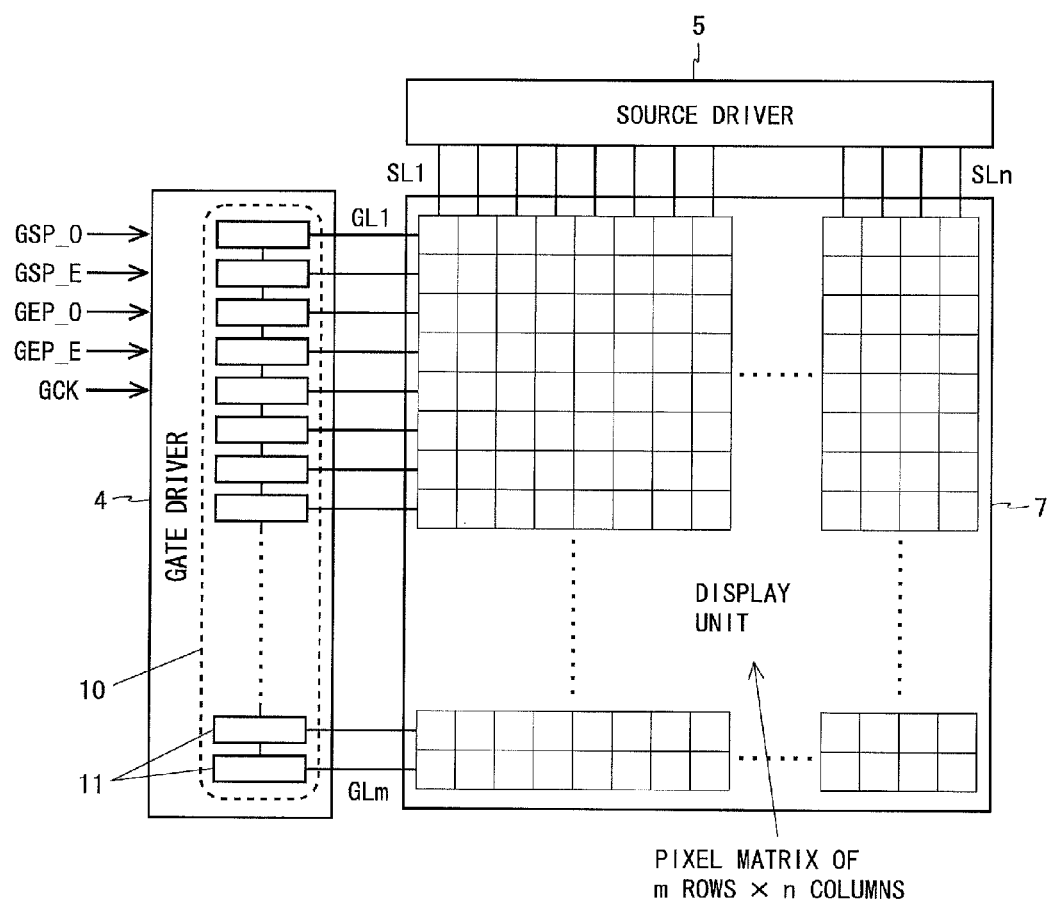
FIG. 2 is a block diagram illustrating a schematic configuration of a gate driver included in the liquid crystal display device shown in FIG. 1.

FIG. 2 is a block diagram illustrating a schematic configuration of the gate driver 4. Referring to FIG. 2, the gate driver 4 is formed with a shift register 10 having a plurality of stages. The display unit 7 is provided with a pixel matrix of m rows×n columns, and each stage of the shift register 10 corresponds to each row of the pixel matrix on a one-to-one basis. Each stage of the shift register 10 is configured as a bistable circuit 11. The bistable circuit 11 holds two states, and is turned to be in either of the states at any given time point, outputs a signal indicating this state (hereinafter referred to as a state signal). As described above, the shift register 10 is configured by the m (=2a) bistable circuits 11.

Figure 3:
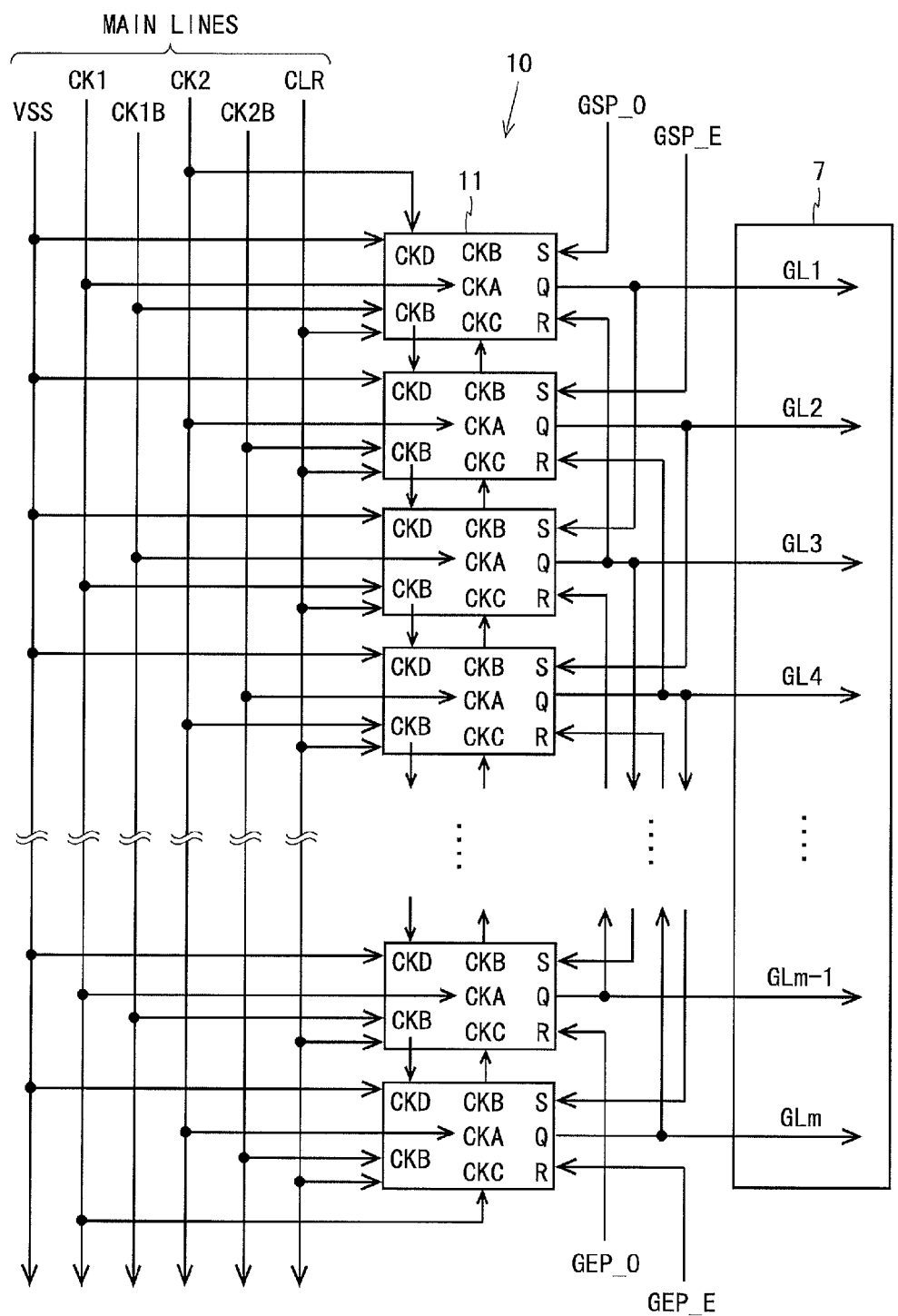
FIG. 3 is a block diagram illustrating the gate driver according to the first embodiment in detail.

FIG. 3 is a block diagram illustrating the gate driver 4 in detail. Referring to FIG. 3, the gate driver 4 is provided with the shift register 10 including the m bistable circuits 11 and main lines including clock signal main lines. In FIG. 3, the shift register 10 is configured by arranging the m bistable circuits 11 in a vertical direction. Further, the shift register 10 is disposed on a left side of the display unit 7. On a left side of the shift register 10, the main lines for the first to fourth gate clock signals CK1, CK1B, CK2, and CK2B, the main line for a low-potential direct-current voltage VSS, and the main line for a clear signal CLR are disposed.

To the bistable circuit 11, clock signals CKA, CKB, CKC, and CKD of four phases (hereinafter referred to as first to fourth clocks), a set signal S, a reset signal R, the clear signal CLR, and the low-potential direct-current voltage VSS are inputted, and a state signal Q is outputted from the bistable circuit 11. In addition, the bistable circuit 11 outputs the inputted second clock CKB to neighboring stages (including an adjacent stage) as a clock signal for the neighboring stages (including the adjacent stage) in the shift register.

The signals supplied to each stage (the bistable circuit 11) of the shift register 10 are stated below. The low-potential direct-current voltage VSS and the clear signal CLR are supplied to all the stages in common. Where k is an integer not smaller than 1 and not greater than a predetermined integer, to the bistable circuit of a (4k−3) th stage, the first gate clock signal CK1 as the first clock CKA and the second gate clock signal CK1B as the second clock CKB are supplied. To the bistable circuit of a (4k−2) th stage, the third gate clock signal CK2 as the first clock CKA and the fourth gate clock signal CK2B as the second clock CKB are supplied. To the bistable circuit of a (4k−1) th stage, the second gate clock signal CK1B as the first clock CKA and the first gate clock signal CK1 as the second clock CKB are supplied. To the bistable circuit of a 4k-th stage, the fourth gate clock signal CK2B as the first clock CKA and the third gate clock signal CK2 as the second clock CKB are supplied. Each stage of the shift register 10 receives the low-potential direct-current voltage VSS, the clear signal CLR, the first clock CKA, and the second clock CKB from the main lines.

To the bistable circuit of an m-th stage (last stage), the first gate clock signal CK1 (when a is an odd number) or the second gate clock signal CK1B (when a is an even number) is supplied as the third clock CKC from the main line. It should be noted that FIG. 3 shows the case where a is an odd number.

To the bistable circuits of stages other than the m-th stage, the second clock CKB outputted from a succeeding stage is supplied as the third clock CKC. To the bistable circuit of a first stage, the third gate clock signal CK2 is supplied as the fourth clock CKD from the main line. To the bistable circuits of stages other than the first stage, the second clock CKB outputted from a preceding stage is supplied as the fourth clock CKD.

To the bistable circuit of the first stage, the first gate start pulse signal GSP_O is supplied as the set signal S.

To the bistable circuit of a second stage, the second gate start pulse signal GSP_E is supplied as the set signal S. To the bistable circuits of stages other than the first and second stages, the state signal Q outputted from a second preceding stage is supplied as the set signal S. To the bistable circuit of the m-th stage, the second gate end pulse signal GEP_E is supplied as the reset signal R. To the bistable circuit of the (m-1) th stage, the first gate end pulse signal GEP_O is supplied as the reset signal R. To the bistable circuits of stages other than the (m-1) th and m-th stages, the state signal Q outputted from a second succeeding stage is supplied as the reset signal R.

Figure 4:
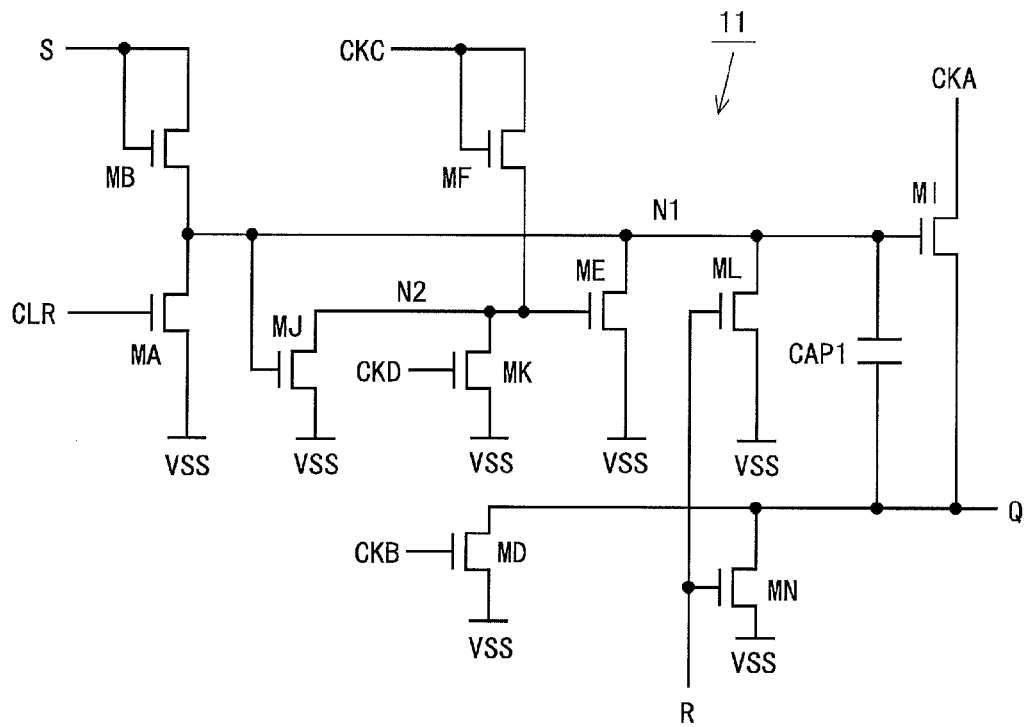
FIG. 4 is a circuit diagram of a bistable circuit included in the gate driver shown in FIG. 3.

FIG. 4 is a circuit diagram of the bistable circuit 11. Referring to FIG. 4, the bistable circuit 11 includes ten thin film transistors MA, MB, MI, MF, MJ, MK, ME, ML, MN, and MD, and a capacitor CAP1. A source terminal of the thin film transistor MB, drain terminals of the thin film transistors MA, ME, and ML, gate terminals of the thin film transistors MJ and MI, and one end of the capacitor CAP1 are connected to the same node (hereinafter referred to as a first node N1). Drain terminals of the thin film transistors MJ and MK, a source terminal of the thin film transistor MF, and a gate terminal of the thin film transistor ME are connected to the same node (hereinafter referred to as a second node N2).

The components included in the bistable circuit 11 have the following functions. The thin film transistor MA keeps a potential of the first node N1 at a low level while the clear signal CLR is at a high level. The thin film transistor MB keeps the potential of the first node N1 at a high level while the set signal S is at a high level. The thin film transistor MI supplies a potential of the first clock CKA to an output terminal Q while the potential of the first node N1 is at a high level. The output terminal Q of the bistable circuit 11 is connected to the corresponding gate bus line, and the first clock CKA is supplied from the main line. The thin film transistor MI functions as a charge control switching device configured to charge the corresponding gate bus line based on the clock signal received from the clock signal main line.

The thin film transistor MF keeps a potential of the second node N2 at a high level while the third clock CKC is at a high level. The thin film transistor MJ keeps the potential of the second node N2 at a low level while the potential of the first node N1 is at a high level. When the potential of the second node N2 becomes a high level during a selection period of the corresponding gate bus line, the thin film transistor ME is turned to an ON state, the potential of the first node N1 decreases, and the thin film transistor MI is turned to an OFF state. The thin film transistor MJ is provided in order to prevent such a phenomenon.

The thin film transistor MK keeps the potential of the second node N2 at a low level while the fourth clock CKD is at a high level. Without providing the thin film transistor MK, the potential of the second node N2 is always at a high level except during selection period of the corresponding gate bus line, and a bias voltage is kept being applied to the thin film transistor ME. If such a state continues, a threshold voltage of the thin film transistor ME increases, and the thin film transistor ME fails to sufficiently function as a switch. The thin film transistor MK is provided in order to prevent such a phenomenon.

The thin film transistor ME keeps the potential of the first node N1 at a low level while the potential of the second node N2 is at a high level. The thin film transistor ML keeps the potential of the first node N1 at a low level while the reset signal R is at a high level. The thin film transistor MN keeps the potential of the output terminal Q at a low level while the reset signal R is at a high level. The thin film transistor MD keeps the potential of the output terminal Q at a low level while the second clock CKB is at a high level. The capacitor CAP1 functions as a compensation capacitance configured to maintain the potential of the first node N1 at a high level during the selection period of the corresponding gate bus line.

Figure 5:
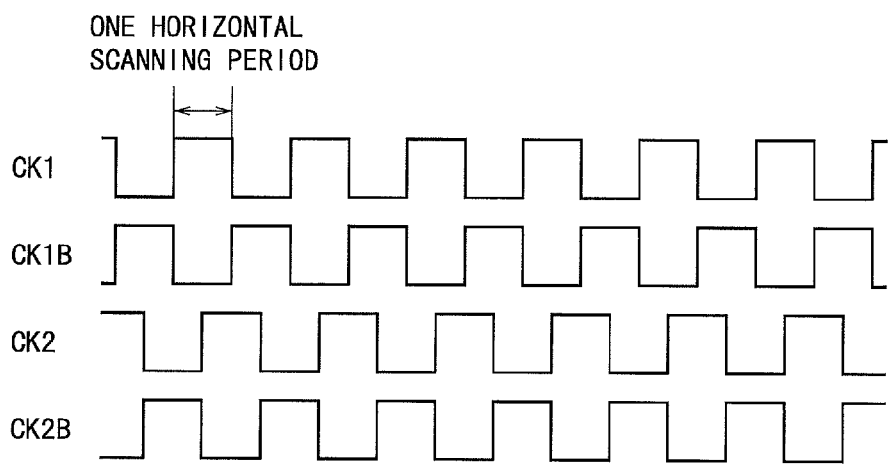
FIG. 5 is a timing chart of gate clock signals inputted to the gate driver shown in FIG. 3.
Figure 6:
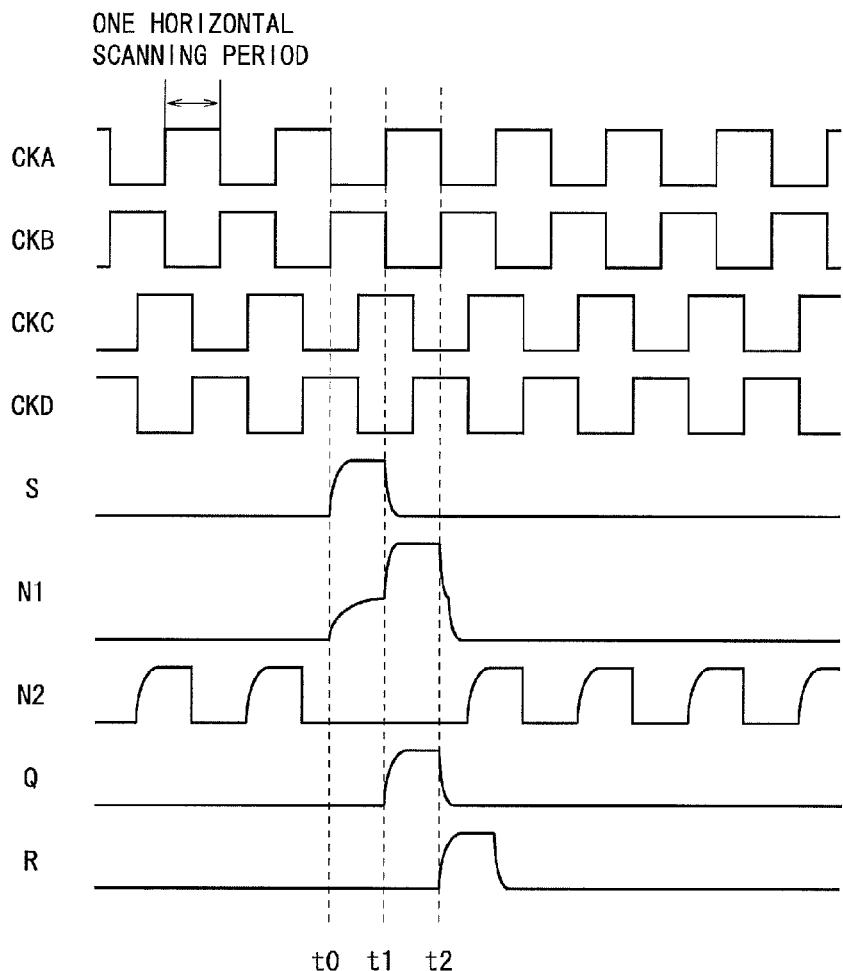
FIG. 6 is a timing chart showing changes in potentials of the bistable circuit included in the gate driver shown in FIG. 3.
Figure 7:
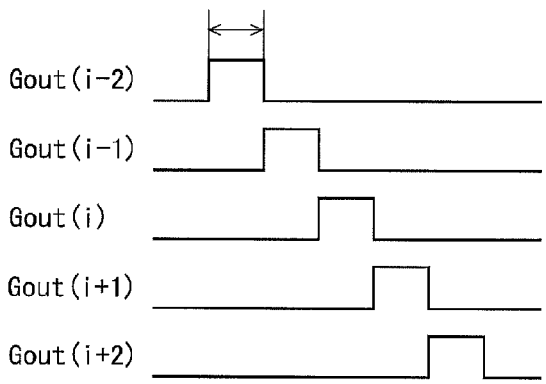
FIG. 7 is a timing chart of scanning signals outputted from the gate driver shown in FIG. 3.

FIG. 5 is a timing chart of the gate clock signals inputted to the gate driver 4. FIG. 6 is a timing chart showing changes in the potentials of the bistable circuits 11. FIG. 7 is a timing chart of the scanning signals outputted from the gate driver 4. In the following description, operations of the bistable circuits 11 and the shift register 10 including the bistable circuits 11 are described with reference to FIGS. 5 to 7.

As shown in FIG. 5, the potentials of the first to fourth gate clock signals CK1, CK1B, CK2, and CK2B become a high level every other horizontal scanning period. A phase of the first gate clock signal CK1 and a phase of the second gate clock signal CK1B are displaced by 180 degrees to each other (a period corresponding to one horizontal scanning period), and a phase of the third gate clock signal CK2 and a phase of the fourth gate clock signal CK2B are also displaced by 180 degrees to each other. The phase of the third gate clock signal CK2 delays by 90 degrees from the phase of the first gate clock signal CK1.

During an operation of the liquid crystal display device, the first to fourth clocks CKA, CKB, CKC, and CKD supplied to the bistable circuit 11 change as shown in FIG. 6. At a time to, the set signal S changes to a high level. As the thin film transistor MB is diode-connected, when the set signal S becomes a high level, the first node N1 is pre-charged to a high level. At this time, as the thin film transistor MJ is turned to the ON state, the potential of the second node N2 changes to a low level. Further, at this time point, the reset signal R is at a low level. Therefore, the thin film transistors ME and ML are in the OFF state. Thus, the potential of the pre-charged first node N1 remains at a high level until a time t2 that will be later described.

At a time t1, the first clock CKA changes from a low level to a high level. The first clock CKA is supplied to a source terminal of the thin film transistor MI, and a parasitic capacitance (not depicted) is present between the gate and the source of the thin film transistor MI. Accordingly, when a source potential of the thin film transistor MI increases, a gate potential of the thin film transistor MI also increases (that is, the first node N1 is bootstrapped). As a result, the thin film transistor MI becomes in a state (ON state) in which a sufficiently high voltage is applied to the gate terminal of the thin film transistor MI. During a time period from the time t1 to the time t2, the first clock CKA is at a high level, and therefore the state signal Q also becomes a high level during this period. This turns the gate bus line connected to the output terminal Q to a selected state, and the video signal is written to the pixel capacitance Cp for the plurality of pixel formation portions connected to this gate bus line.

At the time t2, the first clock CKA changes from a high level to a low level, and the second clock CKB and the reset signal R change from a low level to a high level. This turns the thin film transistors MD, ML, and MN to the ON state. When the thin film transistors MD and MN are turned to the ON state, the state signal Q becomes a low level. When the thin film transistor ML is turned to the ON state, the potential of the first node N1 becomes a low level. As a result, the state signal Q is at a high level after the set signal S becomes a high level until the reset signal R becomes a high level, and while the first clock CKA is at a high level.

The m bistable circuits 11 are connected as shown in FIG. 3, the first to fourth gate clock signals CK1, CK1B, CK2, and CK2B are changed as shown in FIG. 5, and then the first gate start pulse signal GSP_O, the second gate start pulse signal GSP_E, the first gate end pulse signal GEP_O, and the second gate end pulse signal GEP_E are controlled to be at a high level at a predetermined timing for one horizontal scanning period. This causes the bistable circuit of an odd-numbered stage to sequentially transfer a pulse included in the first gate start pulse signal GSP_O from the first stage to the (m-1) th stage. Similarly, the bistable circuit of an even-numbered stage sequentially transfers a pulse included in the second gate start pulse signal GSP_E from the second stage to the m-th stage. Therefore, the state signals Q respectively outputted from the stages of the shift register 10 sequentially become a high level. The state signals Q are supplied to the gate bus lines GL1 to GLm respectively as the scanning signals Gout(1) to Gout(m). With this, as shown in FIG. 7, the scanning signals Gout(1) to Gout(m) that sequentially become a high level for one horizontal scanning period are supplied to the gate bus lines GL1 to GLm provided for the display unit 7.

Figure 8:
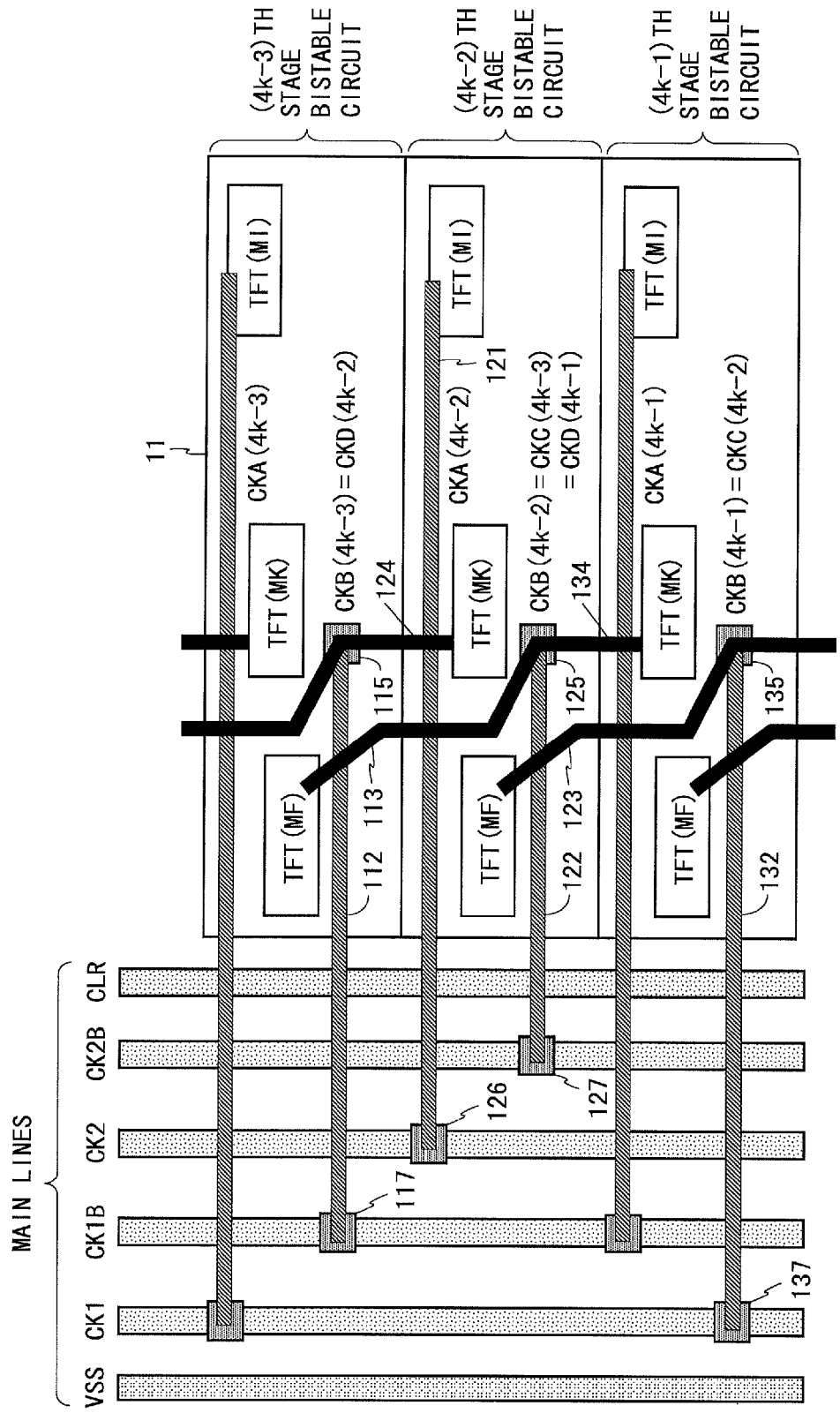
FIG. 8 is a schematic diagram illustrating a layout of the gate driver shown in FIG. 3.

FIG. 8 is a schematic diagram illustrating a layout of the gate driver 4. In the schematic diagram illustrating the layout in the following description, thick straight lines and polygonal lines represent wire lines, and small squares provided at intersections between the wire lines represent contacts. To the three bistable circuits shown in FIG. 8, it is necessary to supply the first clock CKA to be supplied to the thin film transistor MI, the second clock CKB for controlling the thin film transistor MD (not depicted), the third clock CKC for controlling the thin film transistor MF, and the fourth clock CKD for controlling the thin film transistor MK.

The three bistable circuits shown in FIG. 8 are respectively provided with contacts 115, 125 and 135. The bistable circuit of the (4k−2)th stage is provided with a line 121 for the first clock CKA, a line 122 for the second clock CKB, a line 123 for the third clock CKC, and a line 124 for the fourth clock CKD. The line 121 for the first clock CKA is connected to the main line for the third gate clock signal CK2 via the contact 126. The line 122 for the second clock CKB is connected to the main line for the fourth gate clock signal CK2B via a contact 127. The line 123 for the third clock CKC is connected to a line 132 for the second clock CKB of the bistable circuit of the (4k−1) th stage via the contact 135 within the bistable circuit of the (4k−1) th stage. The line 132 is connected to the main line for the first gate clock signal CK1 via a contact 137. The line 124 for the fourth clock CKD is connected to a line 112 for the second clock CKB of the bistable circuit of the (4k−3) th stage via the contact 115 within the bistable circuit of the (4k−3) th stage. The line 112 is connected to the main line for the second gate clock signal CK1B via a contact 117.

Further, the line 122 for the second clock CKB is connected to a line 113 for the third clock CKC of the bistable circuit of the (4k−3) th stage and to a line 134 for the fourth clock CKD of the bistable circuit of the (4k−1) th stage via the contact 125 within the bistable circuit of the (4k−2) th stage. The other bistable circuits included in the shift register 10 are also laid out in a manner similar to that shown in FIG. 8. As described above, each stage of the shift register 10 receives a part of the four clock signals from the clock signal main lines, and receives a remaining part of the clock signals (clock signals that are not received from the clock signal main lines) from the preceding or succeeding stage.

Referring here to FIG. 3, the set signal S, the reset signal R, and the state signal Q are exchanged between the odd-numbered stages or the even-numbered stages in the shift register 10. Therefore, it can be said that the shift register 10 includes an odd-numbered stage shift register constituted only by the odd-numbered stages, and an even-numbered stage shift register constituted only by the even-numbered stages. Further, a stage preceding or succeeding to the odd-numbered stage is an even-numbered stage, and a stage preceding or succeeding to the even-numbered stage is an odd-numbered stage. Therefore, it can be said that each stage of the odd-numbered stage shift register receives the remaining part of the clock signals from a stage provided adjacently in the even-numbered stage shift register, and each stage of the even-numbered stage shift register receives the remaining part of the clock signals from a stage provided adjacently in the odd-numbered stage shift register. As described above, each stage of the shift register 10 receives the remaining part of the clock signals from the other shift register (more specifically, from a stage provided adjacently in the other shift register).

Further, the line 121 for the first clock CKA intersects with the line 113 for the third clock CKC and the line 124 for the fourth clock CKD of the bistable circuit of the (4k−3) th stage. The line 122 for the second clock CKB intersects with the line 123 for the third clock CKC. As described above, the leading lines from the clock signal main lines intersect with the clock lines for receiving the remaining part of the clock signals from the stage provided adjacently in the other shift register.

As described above, the gate driver 4 according to this embodiment is provided with the plurality of shift registers (the odd-numbered stage shift register and the even-numbered stage shift register), and the clock signal main lines. The clock signal main lines are configured by the four signal lines respectively transmitting the four clock signals, and provided on an opposite side of the display unit 7 with respect to the shift register 10. The odd-numbered stage shift register is configured by the plurality stages, and sequentially shifts the pulse supplied to the first stage based on the four clock signals that are supplied to each stage, and drives the odd-numbered gate bus lines GL1, GL3, . . . , and GLm−1. The even-numbered stage shift register is configured in the same manner as the odd-numbered stage shift register, and drives the even-numbered gate bus lines GL2, GL4, . . . , and GLm.

Each stage of the shift register 10 receives the part of the clock signals from the clock signal main lines, and receives the remaining part of the clock signals from the stage provided adjacently in the other shift register. The phases of the remaining part of the clock signals (the third clock CKC and the fourth clock CKD) are displaced by 90 degrees from the phase of the clock signal (the first clock CKA) that is supplied from the clock signal main line to the charge control switching device (the thin film transistor MI). Each stage of the shift register 10 includes a contact (for example, the contact 125) for supplying the clock signal received from the clock signal main line to both the preceding-side and the succeeding-side stage of the other shift register.

Figure 9:
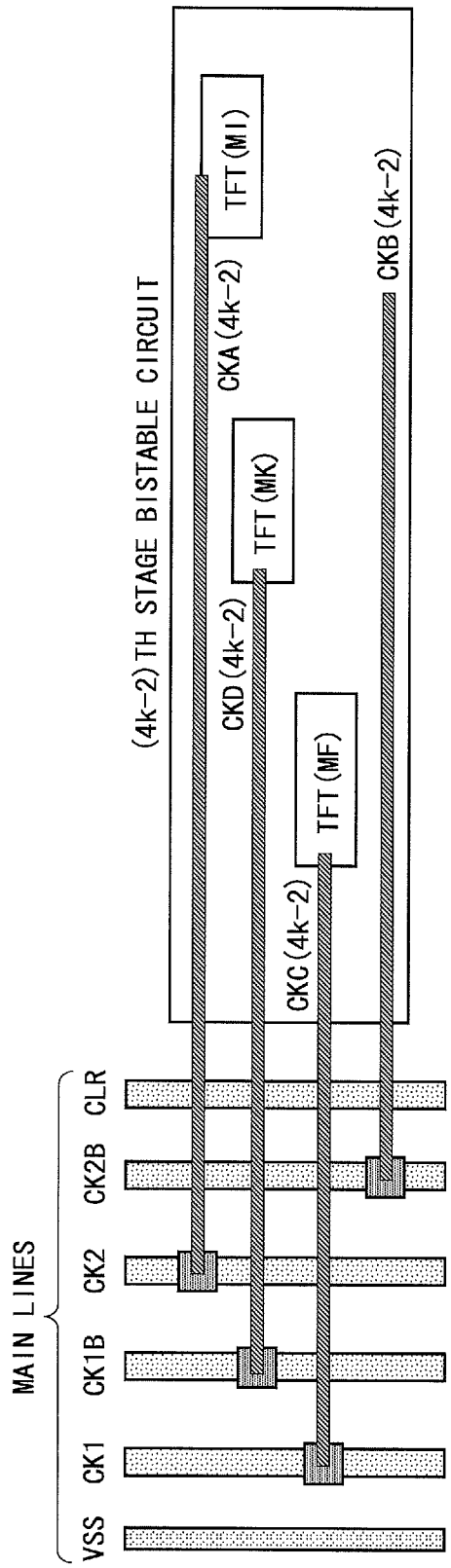
FIG. 9 is a schematic diagram illustrating a layout of a conventional gate driver.

In the following, effects of the gate driver 4 according to this embodiment and the liquid crystal display device having the gate driver 4 are described. FIG. 9 is a schematic diagram illustrating a layout of a conventional gate driver. According to the gate driver, each stage of a shift register receives all of the four clock signals necessary for the operation from the main lines (see FIG. 9). By contrast, in the gate driver 4 according to this embodiment, each stage of the shift register 10 receives the part of the four clock signals necessary for the operation from the clock signal main lines, and receives the remaining part of the clock signals from the other shift register included in the gate driver 4 (see FIGS. 3 and 8). Accordingly, in this embodiment, as compared to the conventional example, the number of wire lines connecting between the main lines and the bistable circuits decreases, and an area for the lines for the clock signals in the bistable circuit becomes smaller. Therefore, according to the gate driver 4 of this embodiment and the liquid crystal display device having the gate driver 4, it is possible to reduce an area of the bistable circuits as well as a picture-frame area of a panel in the display device provided with the gate driver including a plurality of shift registers.

Figure 10A:
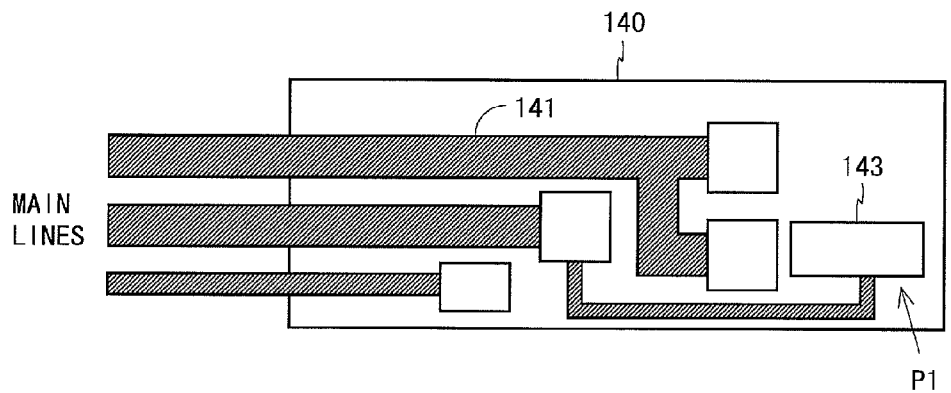
FIG. 10A is a schematic diagram illustrating a layout of a conventional bistable circuit.
Figure 10B:
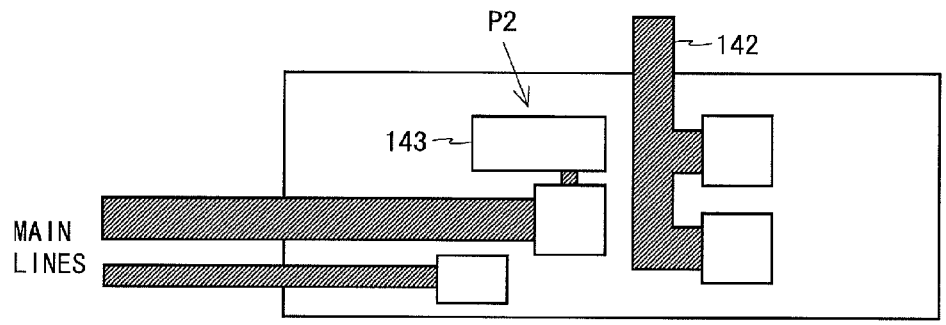
FIG. 10B is a schematic diagram illustrating a layout of a bistable circuit after elements are moved.
Figure 10C:
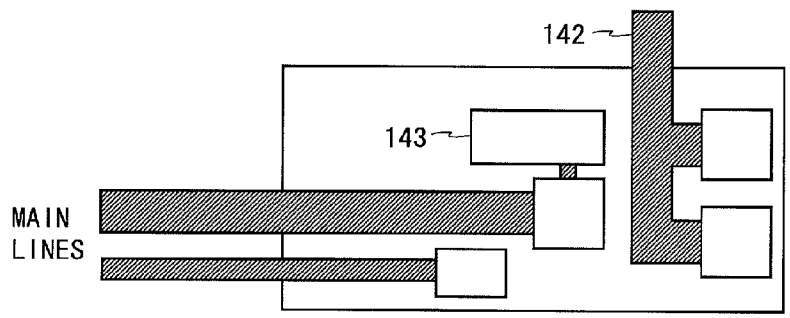
FIG. 10C is a schematic diagram illustrating a layout of the bistable circuit according to the first embodiment.
Figure 11:
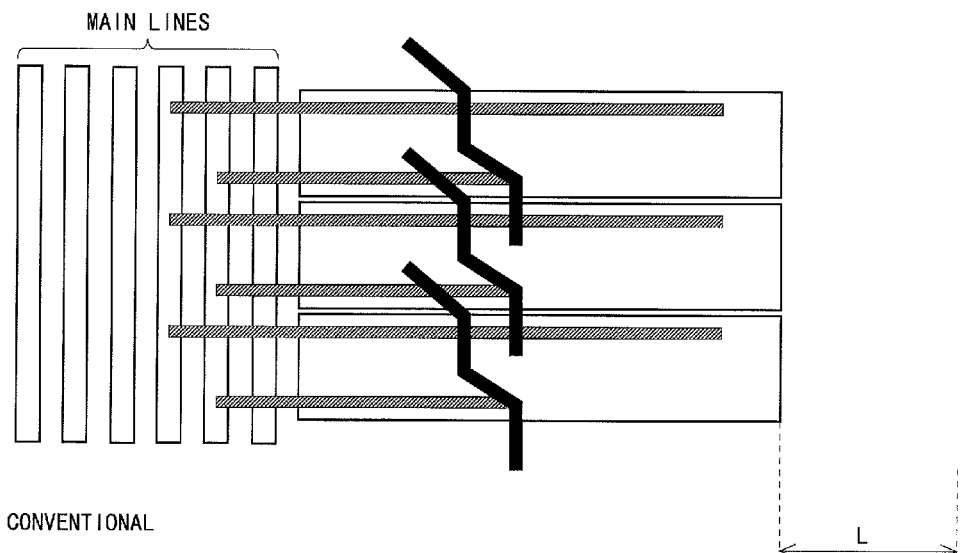
FIG. 11 is a diagram for explaining an effect of the gate driver according to the first embodiment.
Figure 11:
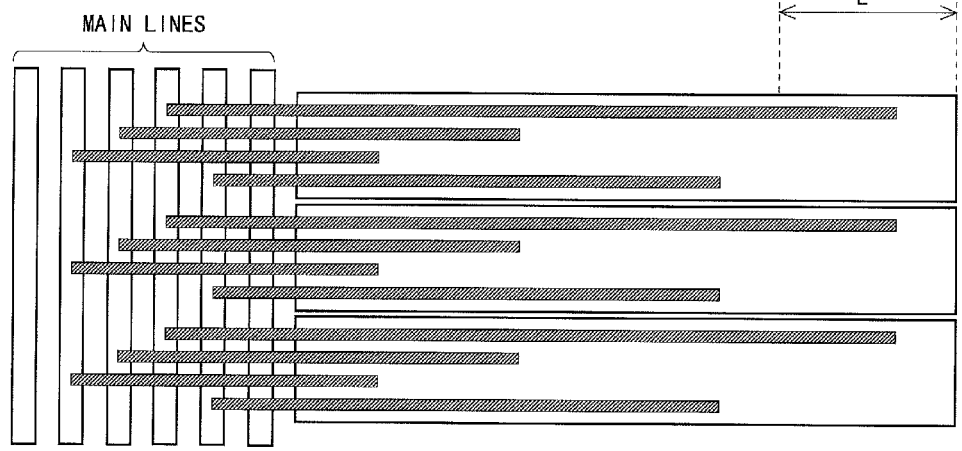

For example, a bistable circuit 140 shown in FIG. 10A is provided with a leading line 141 for supplying the clock signal from the main line, and an element 143 is provided at a position P1. The bistable circuit 140 is configured such that the line 142 is provided between the bistable circuit 140 and an adjacently provided stage of the other shift register, and the clock signals are received using the line 142 (see FIG. 10B). This eliminates the necessity of the leading line 141, and allows provision of the element 143 at a position P2. As a result, as shown in FIG. 10C, it is possible to reduce a layout area for the bistable circuit 140. Therefore, as shown in FIG. 11, the width of the picture-frame area can be reduced by a length L in a direction in which the gate bus line extends. Thus, it is possible to easily form a gate driver even on a panel having a relatively small area that can be used as the picture-frame area (for example, a small or medium size panel). In addition, a gate driver having an equivalent function with the conventional example can be formed on a panel having a picture-frame area smaller than that in the conventional example.

Further, in FIG. 8, a contact for connecting the line 122 for the second clock CKB of the bistable circuit of the (4k−2) th stage with the line 113 for the third clock CKC of the bistable circuit of the (4k−3) th stage, and a contact for connecting the line 122 with the line 134 for the fourth clock CKD of the bistable circuit of the (4k−1) th stage are achieved by the single contact 125. As described above, by providing each stage of the shift register 10 with a contact for supplying the clock signal received from the clock signal main line to both the preceding-side and succeeding-side stages of the other shift register, it is possible to further reduce the picture-frame of the panel.

Figure 12:
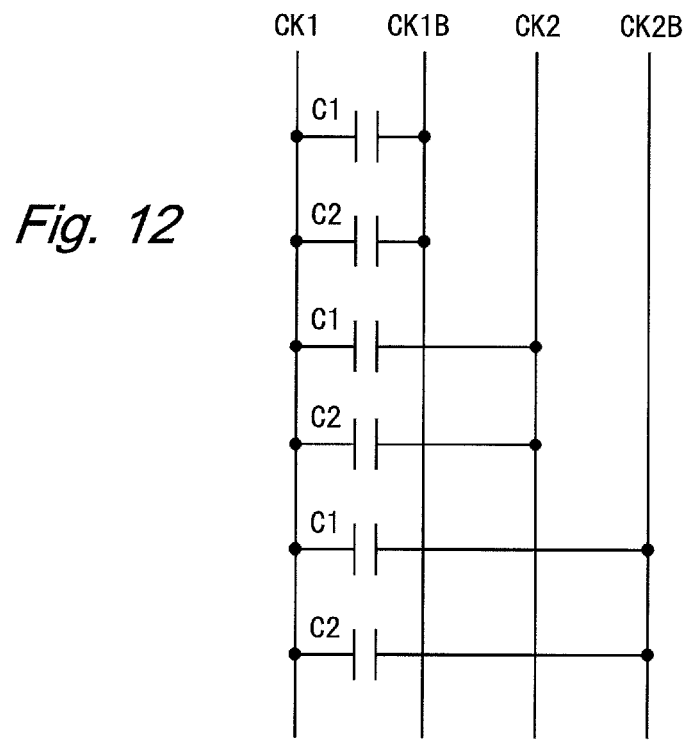
FIG. 12 is a schematic diagram illustrating a load capacitance in the gate driver according to the first embodiment.
Figure 13:
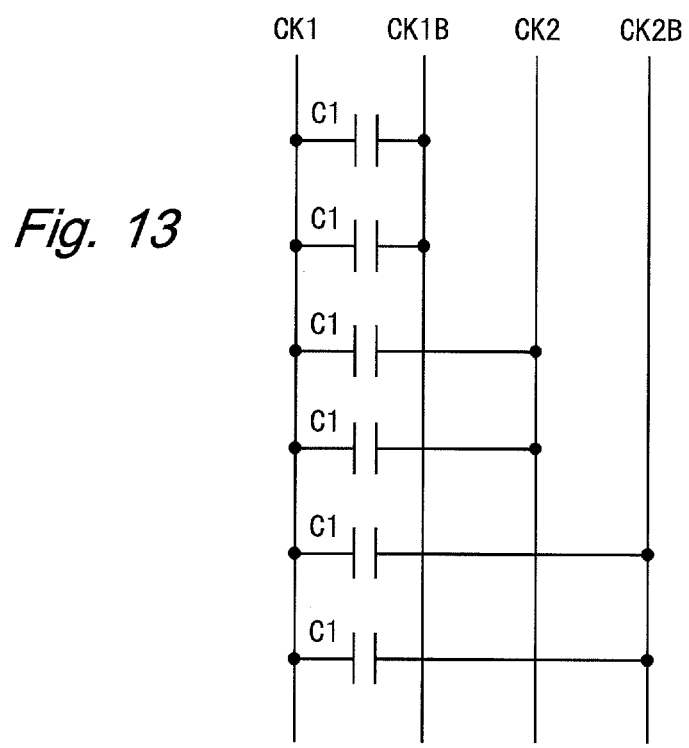
FIG. 13 is a schematic diagram illustrating a load capacitance in the conventional gate driver.

Moreover, according to this embodiment, a load capacitance accompanied by the clock signal main line can be reduced to, for example, about half of the conventional example. This is explained with reference to FIGS. 12 and 13. FIG. 12 is a schematic diagram illustrating the load capacitance accompanied by a single main line for every two of the bistable circuits in the gate driver 4 according to this embodiment. FIG. 13 is a schematic diagram illustrating the same contents shown in FIG. 12 for the conventional gate driver. When a capacitance value C1 is obtained based on an area of an intersection between the main line and the leading line, the capacitance value C1 is 90 fF, for example. Further, when a capacitance value C2 is obtained based on an area of an intersection between the clock lines in the area of the shift register, the capacitance value C2 is 5 fF, for example. It should be noted that the main lines are generally more than 10 times wider than the clock lines in the area of the shift register. In this example, the load capacitance according to this embodiment is reduced to about half of the conventional example. Therefore, it is possible to suppress mutual interference between the clock signals, and to reduce waveform rounding in the clock signals. Thus, as compared to the conventional example, it is possible to downsize the thin film transistors that constitute the shift register, thereby reducing the picture-frame area of the panel.

Modified Examples of First Embodiment

From this embodiment, modified examples as described below can be obtained. In the above description, each stage of the shift register 10 receives the clock signals that are not received from the clock signal main lines from the preceding or succeeding stage. However, the present invention is not limited to such an example. Each stage of the shift register may receive the clock signals that are not received from the clock signal main lines from a stage other than the preceding or succeeding stage of the shift register. Alternatively, each stage of the shift register may receive the first clock CKA supplied to the preceding stage as the fourth clock CKD, and the first clock CKA supplied to the succeeding stage as the third clock CKC. In addition, the bistable circuit 11 shown in FIG. 4 may include a capacitor, in place of the thin film transistor MF, between an input terminal for the third clock CKC and the second node N2.

Figure 14:
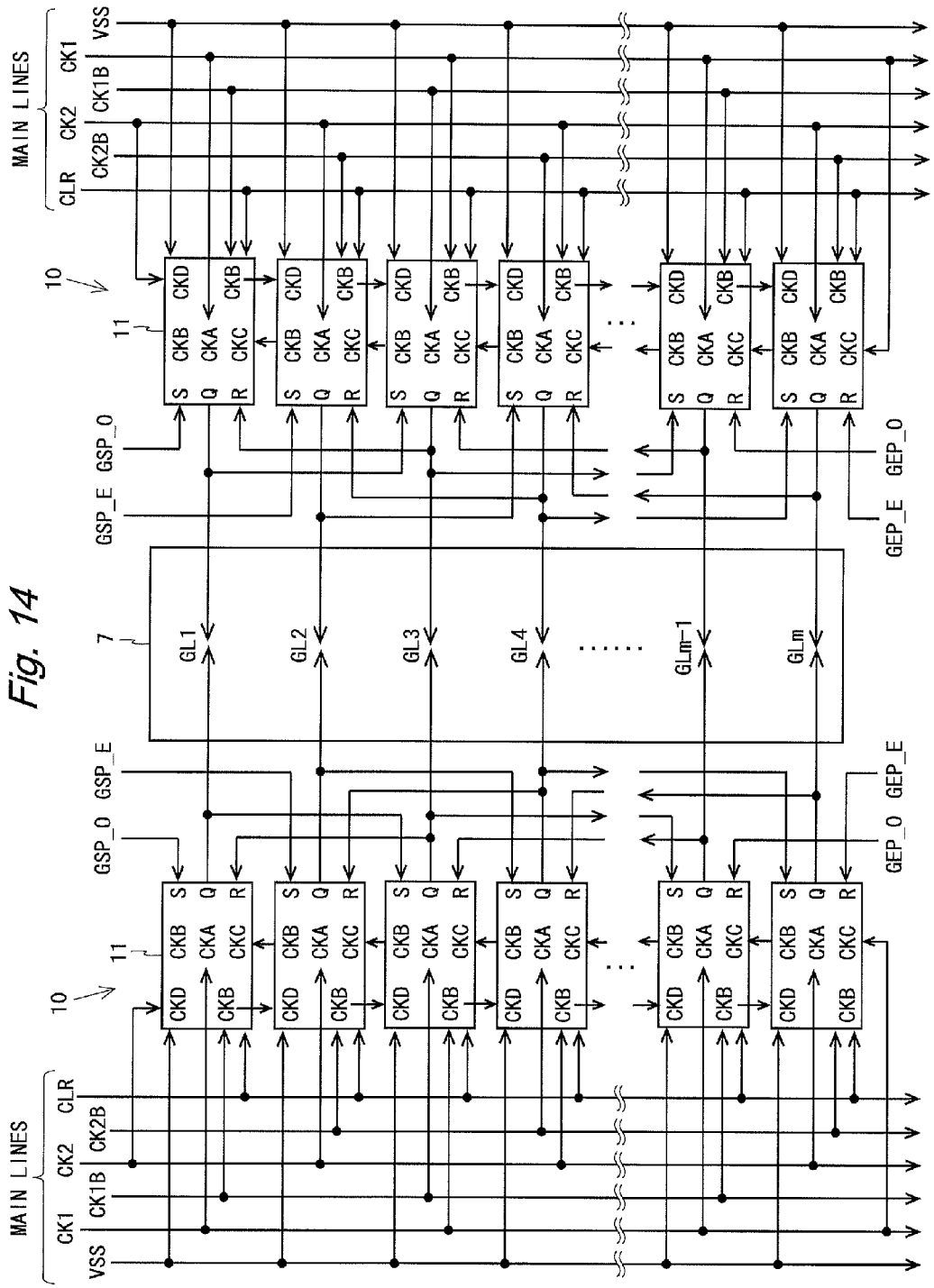
FIG. 14 is a block diagram illustrating a configuration of a liquid crystal display device according to a modified example of the first embodiment.

Further, in the above description, the gate driver 4 is disposed on one side of the display unit 7. However, as shown in FIG. 14, gate drivers can be provided on both sides of the display unit 7. According to this configuration, it is possible to charge a single gate bus line from the both sides of the display unit 7, thereby eliminating a problem of insufficient charge of a large size panel.

Figure 15:
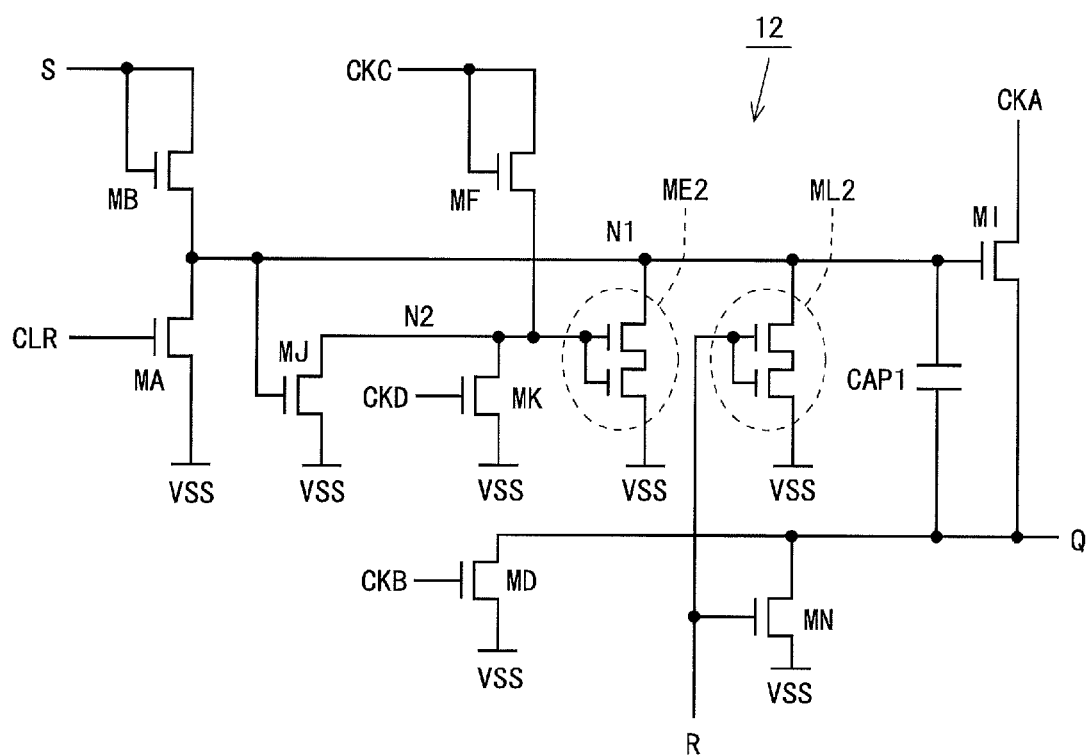
FIG. 15 is a circuit diagram of a bistable circuit included in a gate driver according to another modified example of first embodiment.

Moreover, in the bistable circuit 11 as shown in FIG. 4, there may be a problem in which while the first node N1 is being bootstrapped, a high voltage is applied between the source and the drain of the thin film transistors ML and ME (or the thin film transistors ML, ME, and MB), a leakage current flows through these thin film transistors, and the potential of the first node N1 changes. Therefore, in order to eliminate this problem, a thin film transistor whose drain electrode or source electrode is connected to the first node N1 may be configured as a multichannel TFT. For example, a bistable circuit 12 shown in FIG. 15 is achieved by configuring the thin film transistors ML and ME as multichannel TFTs (ML2 and ME2). With the bistable circuit 12, it is possible to prevent a leakage current from flowing through the thin film transistors ML and ME and the potential of the first node N1 from decreasing. The use of multichannel TFTs is effective for a circuit using microcrystalline silicon having a relatively large off current.

Figure 16A:
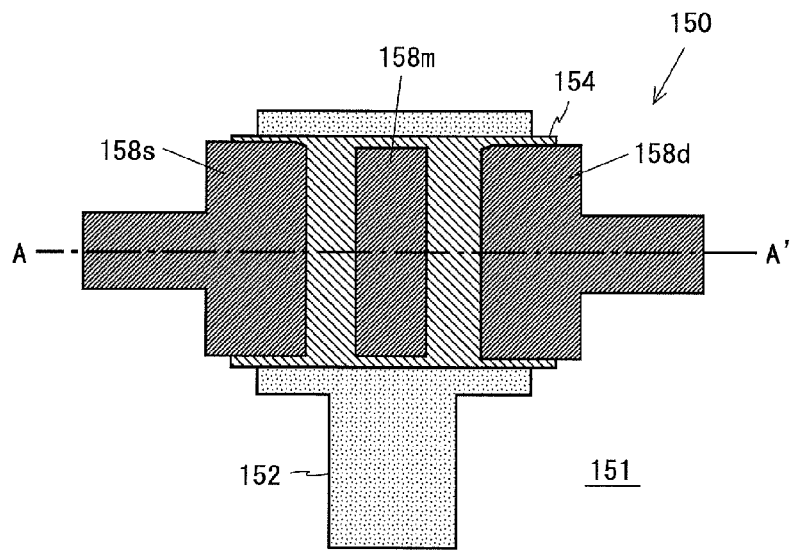
FIG. 16A is a plan view of multichannel TFT.
Figure 16B:
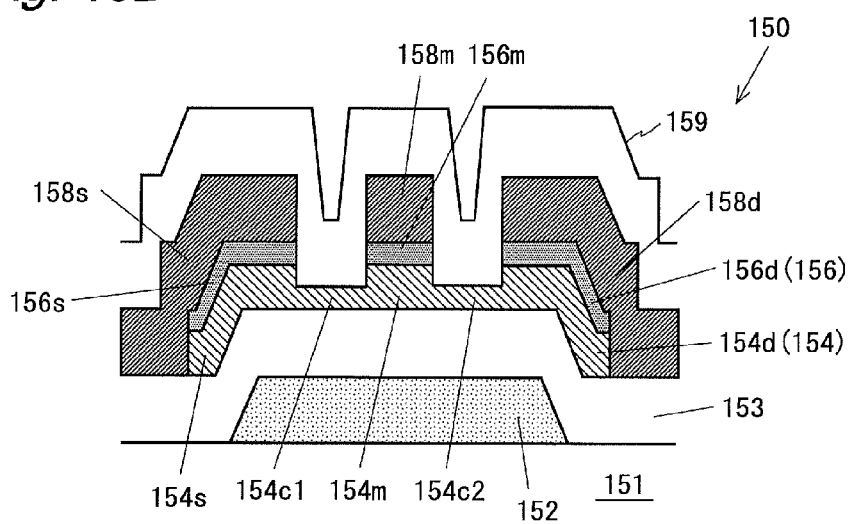
FIG. 16B is a cross-sectional view of the multichannel TFT.
Figure 16C:
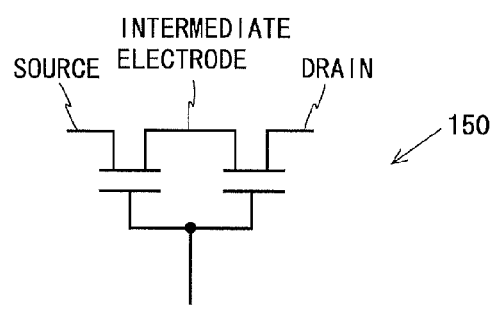
FIG. 16C is an equivalent circuit diagram of the multichannel TFT.

In the following description, the multichannel TFT is described with reference to FIGS. 16A to 16C. FIG. 16A is a plan view of the multichannel TFT, FIG. 16B is a cross-sectional view taken along line A-A' in FIG. 16A, and FIG. 16C is an equivalent circuit diagram of the multichannel TFT. A multichannel TFT 150 shown in FIGS. 16A and 16B has a dual-gate structure (double-gate structure), and electrically equivalent to two TFTs that are connected in series (FIG. 16C).

The multichannel TFT 150 is provided with an active layer 154 supported by a substrate 151 (glass substrate, for example). The active layer 154 is a semiconductor layer and includes a microcrystalline silicon (μc-Si) film. The active layer 154 is provided with channel regions 154c1 and 154c2 (hereinafter referred to as two channel regions), a source region 154s, a drain region 154d, and an intermediate region 154m formed between the two channel regions. The multichannel TFT 150 is further provided with a contact layer 156, an electrode layer 158, a gate electrode 152, and a protection film 159 that covers these components. The contact layer 156 includes a source contact region 156s in contact with the source region 154s, a drain contact region 156d in contact with the drain region 154d, and an intermediate contact region 156m in contact with the intermediate region 154m. The electrode layer 158 includes a source electrode 158s in contact with the source contact region 156s, a drain electrode 158d in contact with the drain contact region 156d, and an intermediate electrode 158n contact with the intermediate contact region 156m. The gate electrode 152 faces toward the two channel regions and the intermediate region 154m with a gate insulation film 153 interposed therebetween. Here, the intermediate electrode 158m is in a floating state.

The channel region 154c1 is formed between the source region 154s and the intermediate region 154m, and the channel region 154c2 is formed between the drain region 154d and the intermediate region 154m. The two channel regions, the source region 154s, the drain region 154d, and the intermediate region 154m are formed into the single continuous active layer 154. Further, a part of the intermediate electrode 158m that is present between the two channel regions as a whole overlaps with the gate electrode 152, with the intermediate region 154m and the gate insulation film 153 interposed therebetween.

The active layer 154 of the multichannel TFT 150 is formed by a microcrystalline silicon film, or a layered film of a microcrystalline silicon film and an amorphous silicon film, and can be manufactured using a manufacturing process for conventional amorphous silicon TFTs. The microcrystalline silicon film can be formed by, for example, employing a plasma CVD (Chemical Vapor Deposition) method similarly to the manufacturing method of the amorphous silicon film, using a silane gas diluted by a hydrogen gas as a material gas. It should be noted that the multichannel TFT can be applied to circuits using amorphous silicon or oxide semiconductor, and not limited to circuits using microcrystalline silicon.

The liquid crystal display device according to second to fourth embodiments of the present invention is different from the liquid crystal display device according to the first embodiment in a configuration of a shift register included in a gate driver. In the following description, the differences of the second to fourth embodiments from the first embodiment are described.

Second Embodiment

Figure 17:
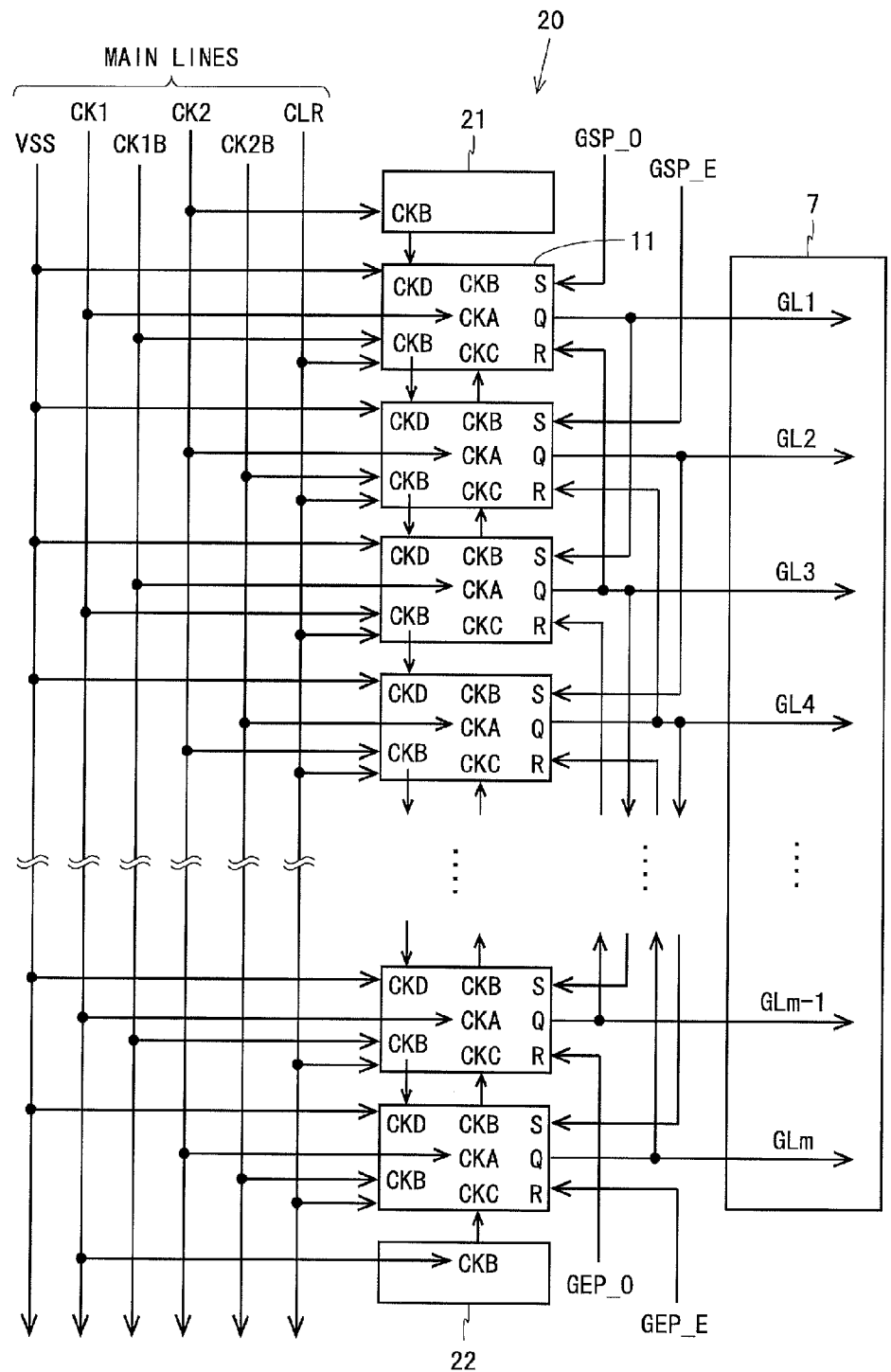
FIG. 17 is a block diagram illustrating a gate driver according to a second embodiment of the present invention in detail.

FIG. 17 is a block diagram illustrating a gate driver according to the second embodiment of the present invention in detail. The gate driver according to this embodiment is provided with a shift register 20 including an odd-numbered stage shift register and an even-numbered stage shift register, and main lines including clock signal main lines. The shift register 20 includes the m (=2a) bistable circuits 11 and dummy bistable circuits 21 and 22 that function as dummy stages. The dummy bistable circuits 21 and 22 do not include a thin film transistor as a switching device. The dummy bistable circuits 21 and 22 include, out of the components included in each stage of the shift register 20, only the components necessary to transmit the clock signal received from the clock signal main line.

The dummy bistable circuit 21 is provided on a side of a first stage of the shift register 20. To the dummy bistable circuit 21, the third gate clock signal CK2 is supplied as the second clock CKB from the main line. The dummy bistable circuit 21 outputs the supplied second clock CKB without change. To the bistable circuit of the first stage, the second clock CKB outputted from the dummy bistable circuit 21 is supplied as the fourth clock CKD.

The dummy bistable circuit 22 is provided on a side of a last stage of the shift register 20. To the dummy bistable circuit 22, the first gate clock signal CK1 (when a is an odd number) or the second gate clock signal CK1B (when a is an even number) is supplied as the second clock CKB from the main line. It should be noted that FIG. 17 shows a case where a is an odd number. The dummy bistable circuit 22 outputs the supplied second clock CKB without change. To the bistable circuit of an m-th stage, the second clock CKB outputted from the dummy bistable circuit 22 is supplied as the third clock CKC.

It should be noted that while each dummy bistable circuit is provided on each of the first and last stage sides of the shift register 20 in this example, a plurality of dummy bistable circuits can be provided on both of the first and last stage sides depending on the number of the clock signals necessary for the operation of the shift register.

Figure 18:
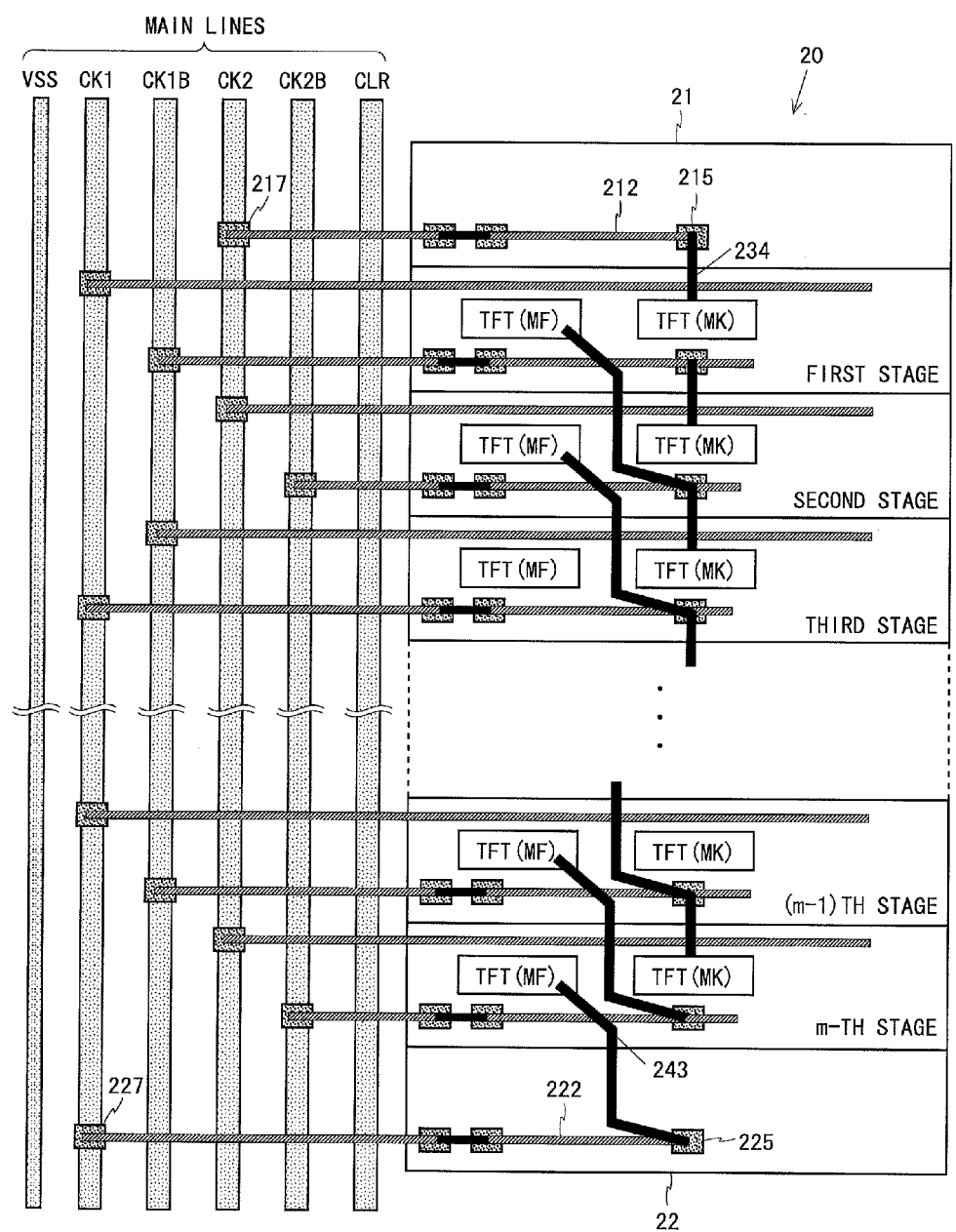
FIG. 18 is a schematic diagram illustrating a layout of the gate driver shown in FIG. 17.

FIG. 18 is a schematic diagram illustrating a layout of the gate driver according to this embodiment. The dummy bistable circuits 21 and 22 include, out of the components included in each stage (the bistable circuit 11) of the shift register 20, only the components necessary to transmit the second clock CKB received from the clock signal main line. The dummy bistable circuit 21 is provided with a line 212 for the second clock CKB and a contact 215. The line 212 is connected to the main line for the third gate clock signal CK2 via a contact 217, and to a line 234 for the fourth clock CKD of the bistable circuit of the first stage via the contact 215 within the dummy bistable circuit 21. The dummy bistable circuit 22 is provided with a line 222 for the second clock CKB and a contact 225. The line 222 is connected to the main line for the first gate clock signal CK1 via a contact 227, and to a line 243 for the third clock CKC of the bistable circuit of the m-th stage via the contact 225 within the dummy bistable circuit 22. Other than this, the layout of the gate driver according to this embodiment is the same as that of the first embodiment. In this embodiment, too, the leading lines from the clock signal main lines intersect with the clock lines for receiving the remaining part of the clock signals from the stage provided adjacently in the other shift register.

As described above, the gate driver according to this embodiment is provided with the plurality of shift registers (the odd-numbered stage shift register and the even-numbered stage shift register), and the clock signal main lines. The plurality of shift registers include a shift register having the dummy bistable circuit 21 that supplies the second clock CKB received from the clock signal main line to the first stage without change (the odd-numbered stage shift register), and a shift register having the dummy bistable circuit 22 that supplies the second clock CKB received from the clock signal main line to the last stage without change (the even-numbered stage shift register).

Therefore, according to this embodiment, as all of the bistable circuits of the first to last stages have the same circuit configuration and the parasitic capacitances become substantially equal, waveform rounding in the clock signals becomes substantially identical. This allows the shift register to operate stably.

Third Embodiment

Figure 19:
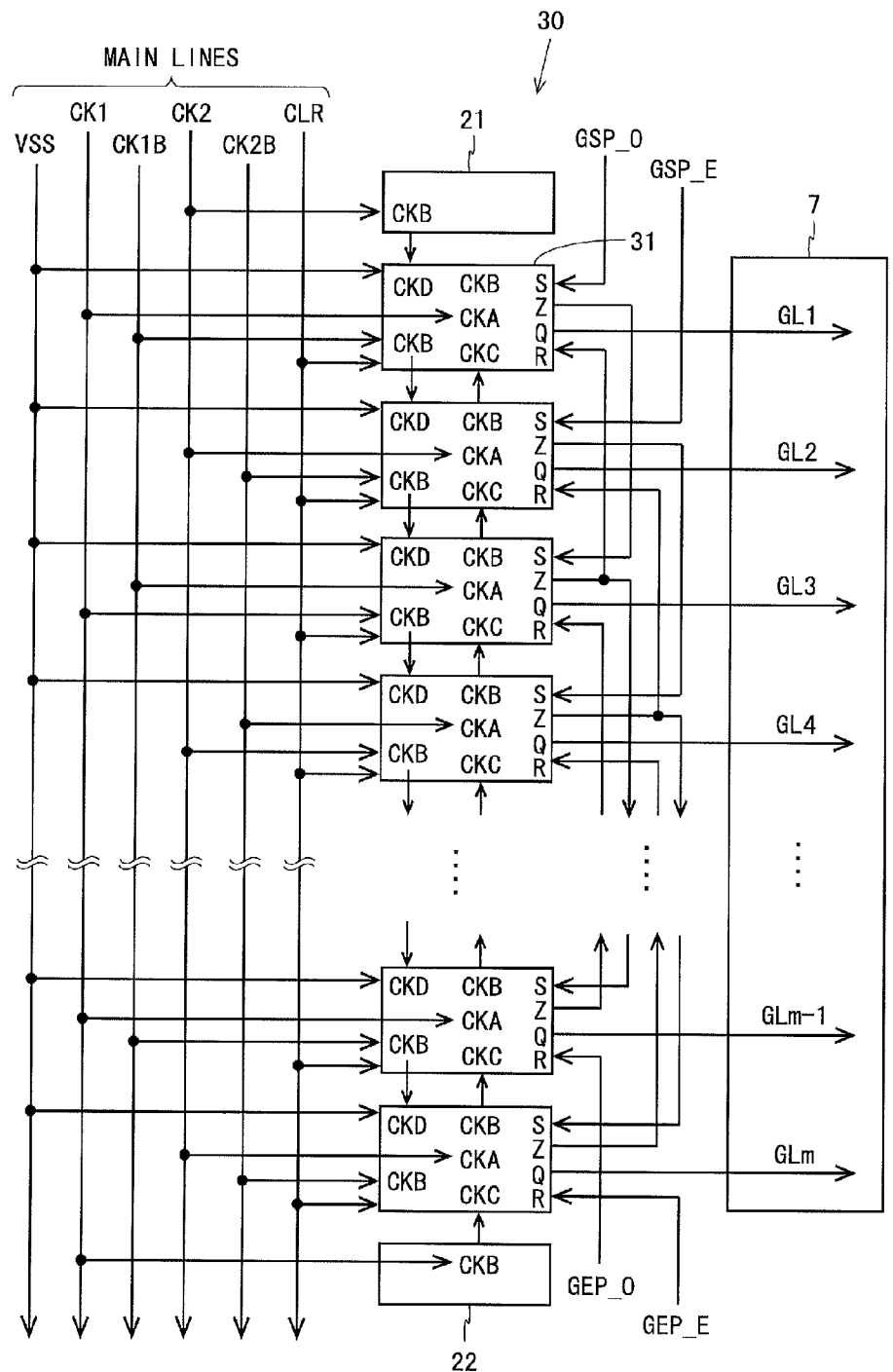
FIG. 19 is a block diagram illustrating a gate driver according to a third embodiment of the present invention in detail.

FIG. 19 is a block diagram illustrating a gate driver according to the third embodiment of the present invention in detail. The gate driver according to this embodiment is provided with a shift register 30 including an odd-numbered stage shift register and an even-numbered stage shift register, and main lines including clock signal main lines. The shift register 30 includes m (=2a) bistable circuits 31 and the dummy bistable circuits 21 and 22. Each bistable circuit 31 is configured such that a function of outputting a signal Z that changes in the same manner as the state signal Q is added to the bistable circuit 11 according to the first embodiment.

Figure 20:
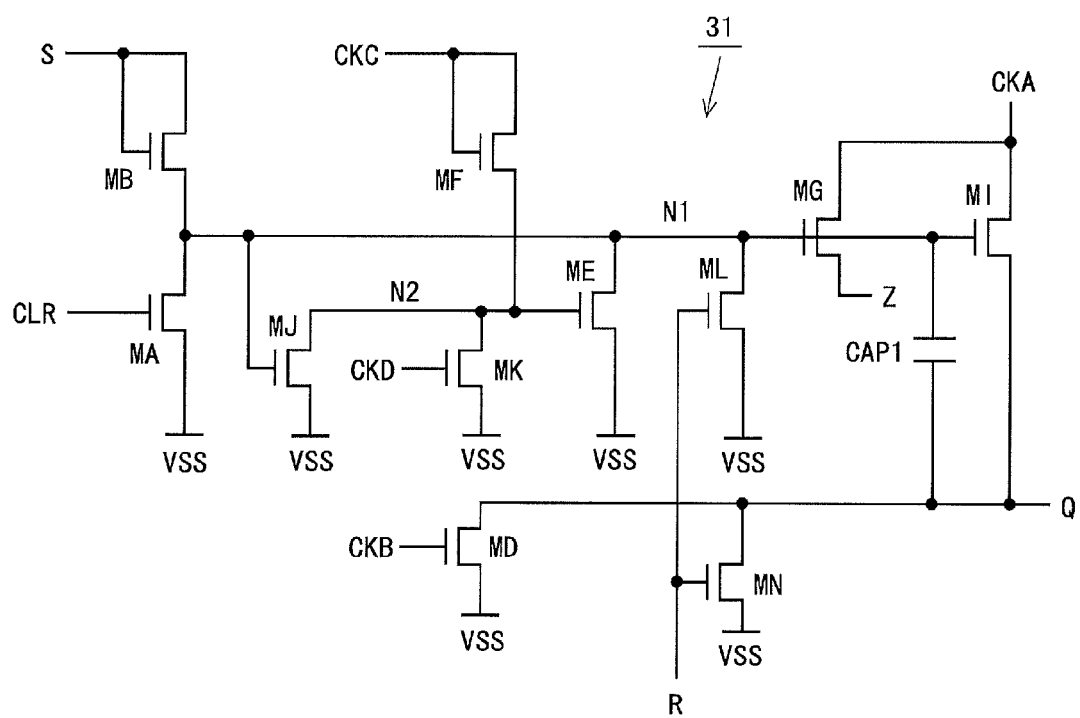
FIG. 20 is a circuit diagram of a bistable circuit included in the gate driver shown in FIG. 19.

FIG. 20 is a circuit diagram of the bistable circuit 31. The bistable circuit 31 is configured such that a thin film transistor MG is added to the bistable circuit 11. The thin film transistor MG outputs the first clock CKA as the signal Z while the potential of the first node N1 is at a high level. According to the first and second embodiments, the state signal Q outputted from the bistable circuit 11 is used as the set signal S and the reset signal R. By contrast, according to this embodiment, the signal Z generated by the thin film transistor MG is used as the set signal S and the reset signal R.

In a large size panel, as a load of the pixel formation portion is large, the state signal Q is susceptible to waveform rounding. Using the state signal Q having waveform rounding as the set signal S and the reset signal R may possibly cause an error in the operation of the shift register. According to this embodiment, by using the signal Z generated separately from the state signal Q as the set signal S and the reset signal R, it is possible to prevent an error in the operation of the shift register due to waveform rounding in the state signal Q.

Figure 21:
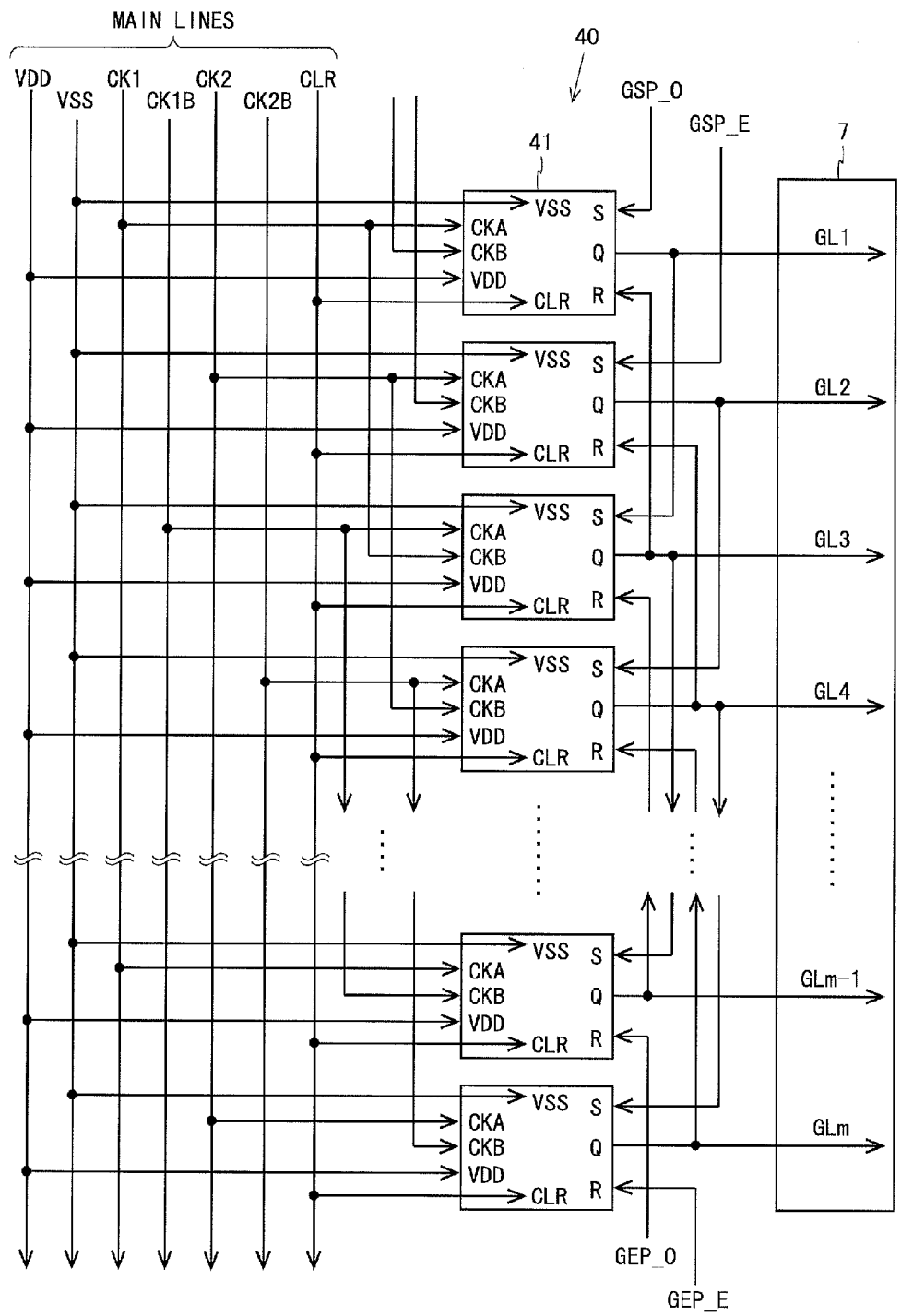
FIG. 21 is a block diagram illustrating a gate driver according to a reference example in detail.
Figure 22:
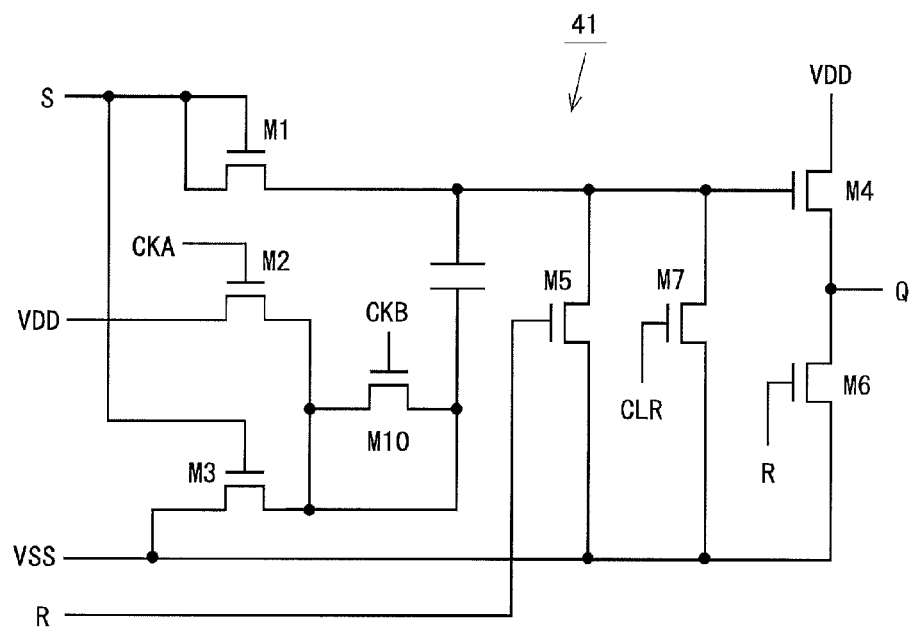
FIG. 22 is a circuit diagram of a bistable circuit included in the gate driver shown in FIG. 21.

FIG. 21 is a block diagram illustrating a gate driver according to a reference example in detail. The gate driver shown in FIG. 21 is provided with a shift register 40 including an odd-numbered stage shift register and an even-numbered stage shift register, and main lines including clock signal mainlines. The shift register 40 includes m (=2a) bistable circuits 41, and two dummy bistable circuits (not depicted). FIG. 22 is a circuit diagram of the bistable circuit 41. The bistable circuit 41 operates based on two clock signals (the first clock CKA and the second clock CKB). In a large size panel, a signal delay easily occurs while the signal is transmitted from the first stage to the last stage of the shift register. Therefore, as shown in FIG. 21, the shift registers whose odd-numbered stage and even-numbered stage are different to each other can be provided. With this, focusing on a single shift register, the number of the stages in a shift register is reduced to half as compared to the conventional example.

The gate driver shown in FIG. 21, similarly to the first to third embodiments, the number of clock signals supplied from the main lines to the bistable circuit ("1", in this case) is smaller than the number of clock signals necessary for operating a single bistable circuit ("2", in this case). As described above, as compared to the conventional example, it is possible to reduce the number of the leading lines from the main lines as well as intersecting portions between the leading lines and the main lines. This effectively prevents the signal from delaying. It should be noted that, also for the gate driver shown in FIG. 21 similarly to the case of the third embodiment, by providing the thin film transistor that generates the signal Z used as the set signal S and the reset signal R for the bistable circuit, it is possible to prevent an error in the operation of the shift register due to waveform rounding in the state signal Q.

Figure 23:
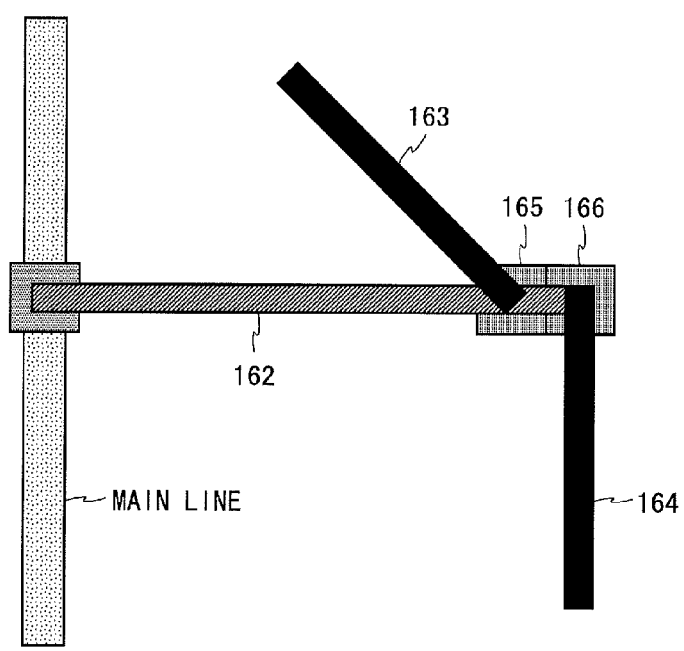
FIG. 23 is a view illustrating an arrangement of contacts in the gate driver according to a modified example of the first to third embodiments.

It should be noted that, according to the first to third embodiments, the contact for connecting the line (connected to the main line) for the second clock CKB of the bistable circuit of one stage with the line for the third clock CKC of the bistable circuit of the preceding stage, and the contact for connecting the line for the second clock CKB of this bistable circuit with the line for the fourth clock CKD of the bistable circuit of the succeeding stage are achieved by a single contact (see FIG. 8). However, the present invention is not limited to such an example. As shown in FIG. 23, it is possible to separately provide a contact 165 for connecting a line 162 for the second clock CKB of the bistable circuit of one stage with a line 163 for the third clock CKC of the bistable circuit of the preceding stage, and a contact 166 for connecting the line 162 with a line 164 for the fourth clock CKD of the bistable circuit of the succeeding stage, and to provide the two contacts 165 and 166 at adjacent positions so as to be in contact with each other, thereby electrically connecting the two contacts. With this, it is possible to reduce a contact resistance as compared to a case in which the two contacts are provided at distant positions;

Fourth Embodiment

Figure 24:
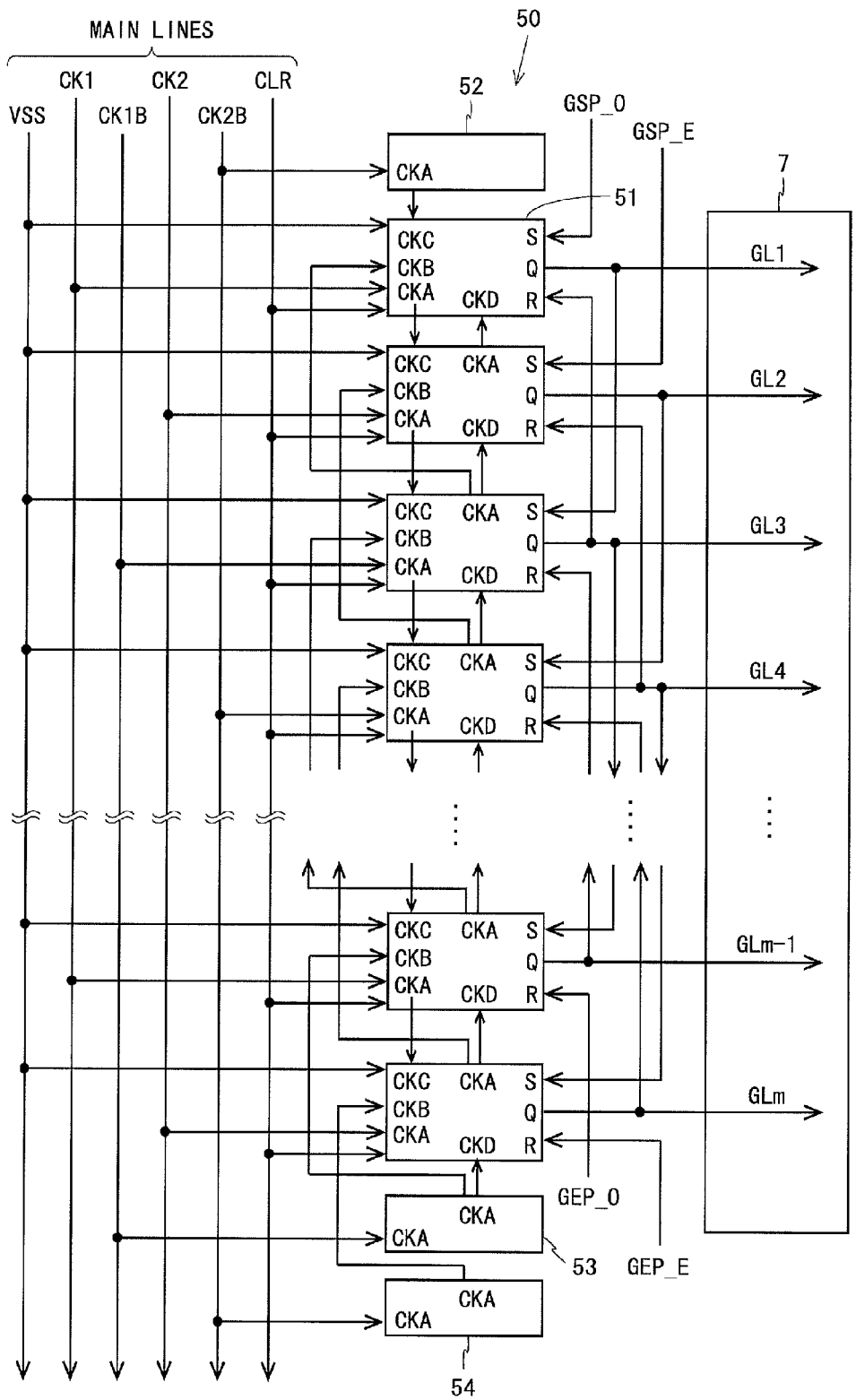
FIG. 24 is a block diagram illustrating a gate driver according to a fourth embodiment of the present invention in detail.

FIG. 24 is a block diagram illustrating a gate driver according to the fourth embodiment of the present invention in detail. The gate driver according to this embodiment is provided with a shift register 50 including an odd-numbered stage shift register and an even-numbered stage shift register, and main lines including clock signal main lines. The shift register 50 includes m (=2a) bistable circuits 51, and dummy bistable circuits 52 to 54 that function as dummy stages.

Each bistable circuit 51 is configured to have the same circuit configuration as that of the bistable circuit 11 according to the first embodiment (see FIG. 4). However, the bistable circuit 51 is different from the bistable circuit 11 in that the bistable circuit 51 outputs the inputted first clock CKA to neighboring stages (including an adjacent stage) as a clock signal for the neighboring stages (including the adjacent stage) in the shift register, while the bistable circuit 11 outputs the inputted second clock CKB to the neighboring stages (including the adjacent stage) as the clock signal for the neighboring stages (including the adjacent stage) in the shift register. Similarly to the dummy bistable circuits 21 and 22 according to the second embodiment, the dummy bistable circuits 52 to 54 do not include a thin film transistor as a switching device, and includes, out of the components included in each stage (the bistable circuit 51) of the shift register 50, only the components necessary to transmit the clock signal received from the clock signal main line.

The dummy bistable circuit 52 is provided on a side of a first stage of the shift register 20. To the dummy bistable circuit 52, the fourth gate clock signal CK2B is supplied as the first clock CKA from the main line. The dummy bistable circuits 53 and 54 are provided on a side of a last stage of the shift register 50. To the dummy bistable circuit 53, the second gate clock signal CK1B (when a is an odd number) or the first gate clock signal CK1 (when a is an even number) is supplied as the first clock CKA from the main line. To the dummy bistable circuit 54, the fourth gate clock signal CK2B (when a is an odd number) or the third gate clock signal CK2 (when a is an even number) is supplied as the first clock CKA from the main line. It should be noted that FIG. 24 shows a case where a is an odd number. The dummy bistable circuits 52 to 54 output the supplied first clock CKA without change.

The signals supplied to each of the stages (the bistable circuits 51) of the shift register 50 are stated below. The low-potential direct-current voltage VSS and the clear signal CLR are supplied to all the stages in common. Where k is an integer not smaller than 1 and not greater than a predetermined integer, to the bistable circuit of a (4k−3) th stage, the first gate clock signal CK1 is supplied as the first clock CKA. To the bistable circuit of a (4k−2) th stage, the third gate clock signal CK2 is supplied as the first clock CKA. To the bistable circuit of a (4k−1) th stage, the second gate clock signal CK1B is supplied as the first clock CKA. To the bistable circuit of a 4k-th stage, the fourth gate clock signal CK2B is supplied as the first clock CKA. Each stage of the shift register 50 receives the low-potential direct-current voltage VSS, the clear signal CLR, and the first clock CKA from the main lines.

To the bistable circuit of a first stage, the first clock CKA outputted from the dummy bistable circuit 52 is supplied as the third clock CKC. To the bistable circuits of stages other than the first stage, the first clock CKA outputted from a preceding stage is supplied as the third clock CKC. To the bistable circuit of an m-th stage (last stage), the first clock CKA outputted from the dummy bistable circuit 53 is supplied as the fourth clock CKD. To the bistable circuits of stages other than the m-th stage, the first clock CKA outputted from a succeeding stage is supplied as the fourth clock CKD.

To the bistable circuit of the m-th stage, the first clock CKA outputted from the dummy bistable circuit 54 is supplied as the second clock CKB. To the bistable circuits of the (m-1)th stage, the first clock CKA outputted from the dummy bistable circuit 53 is supplied as the second clock CKB. To the bistable circuits of stages other than the (m-1)th and the m-th stage, the first clock CKA outputted from a second succeeding stage is supplied as the second clock CKB.

Figure 25:
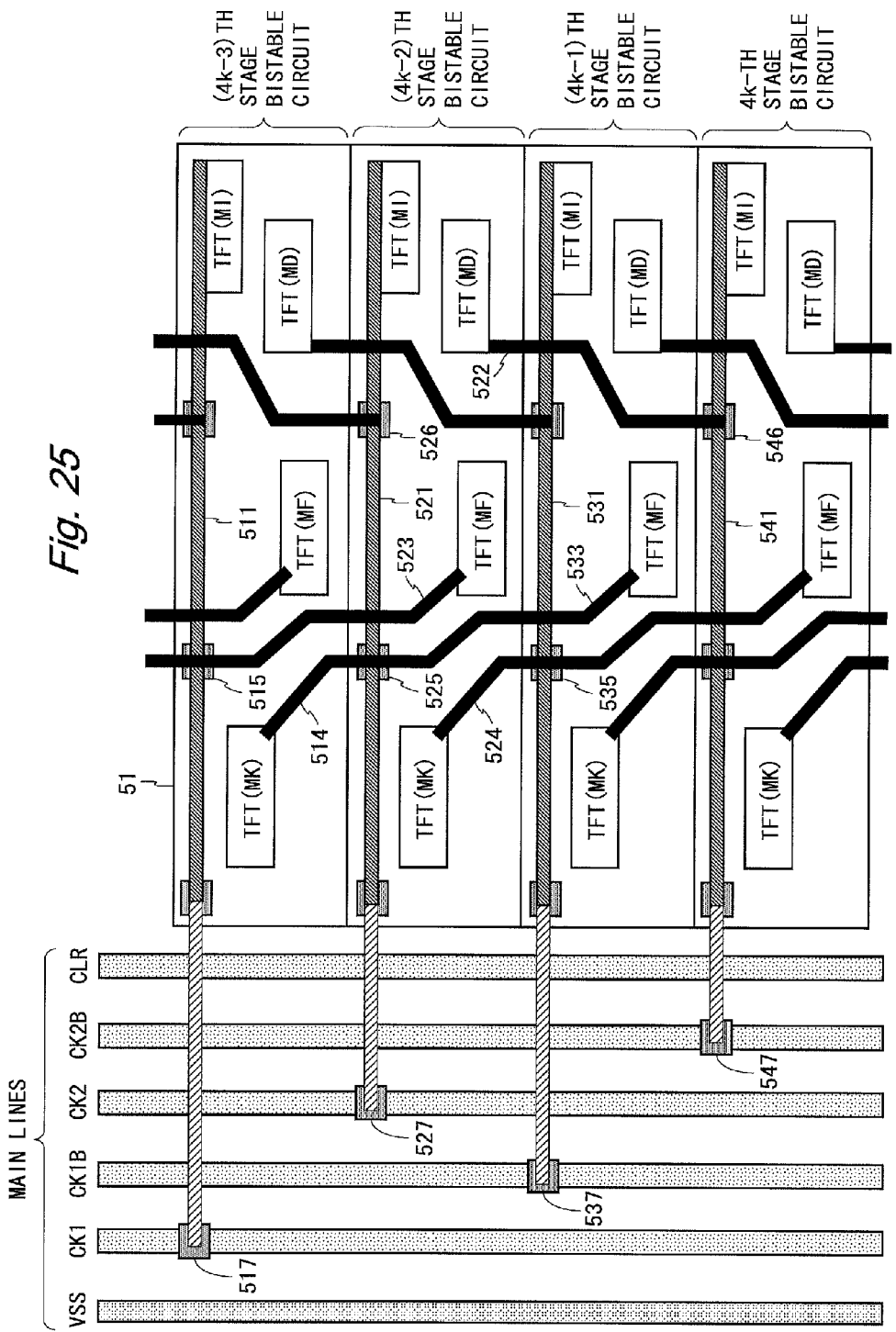
FIG. 25 is a schematic diagram illustrating a layout of the gate driver shown in FIG. 24.
Figure 26:
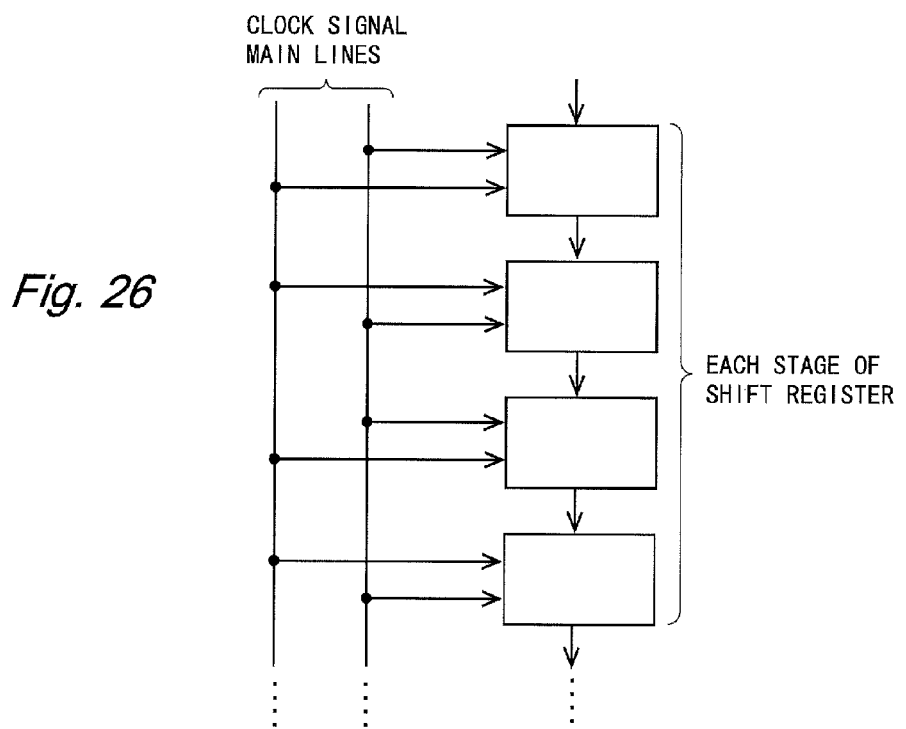
FIG. 26 is a diagram illustrating how clock signals are supplied in a gate driver.
Figure 27:
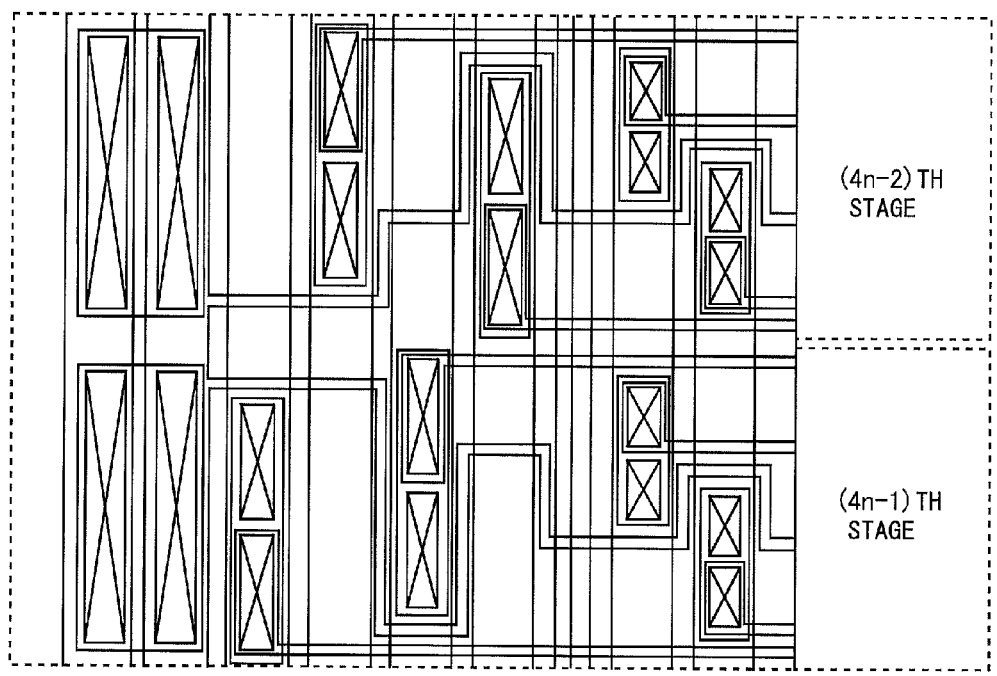
FIG. 27 is a layout diagram of a gate driving unit disclosed in Patent Document 1.

FIG. 25 is a schematic diagram illustrating a layout of the gate driver according to this embodiment. To the four bistable circuits shown in FIG. 25, it is necessary to supply the first clock CKA to be supplied to the thin film transistor MI, the second clock CKB for controlling the thin film transistor MD, the third clock CKC for controlling the thin film transistor MF, and the fourth clock CKD for controlling the thin film transistor MK.

The bistable circuit of the (4k-2)th stage shown in FIG. 25 is provided with a line 521 for the first clock CKA, a line 522 for the second clock CKB, a line 523 for the third clock CKC, a line 524 for the fourth clock CKD, and contacts 525 and 526. The line 521 for the first clock CKA is connected to the main line for the third gate clock signal CK2 via a contact 527. The line 522 for the second clock CKB is connected to a line 541 for the first clock CKA of the bistable circuit of a 4k-th stage via a contact 546 provided for the bistable circuit of the 4k-th stage. The line 541 is connected to the main line for the fourth gate clock signal CK2B via a contact 547. The line 523 for the third clock CKC is connected to a line 511 for the first clock CKA of the bistable circuit of the (4k-3)th stage via a contact 515 provided for the bistable circuit of the (4k-3)th stage. The line 511 is connected to the main line for the first gate clock signal CK1 via a contact 517. The line 524 for the fourth clock CKD is connected to a line 531 for the first clock CKA of the bistable circuit of the (4k-1)th stage via a contact 535 provided for the bistable circuit of the (4k-1)th stage. The line 531 is connected to the main line for the second gate clock signal CK1B via a contact 537.

Further, the line 521 for the first clock CKA is connected to a line 533 for the third clock CKC of the bistable circuit of the (4k-1)th stage and to a line 514 for the fourth clock CKD of the bistable circuit of the (4k-3)th stage via a contact 525 within the bistable circuit of the (4k-2)th stage. Moreover, the line 521 is connected to a line (not depicted) for the second clock CKB of the bistable circuit of a (4k-4)th stage via a contact 526 within the bistable circuit of the (4k-2)th stage. The other bistable circuits included in the shift register 50 are also laid out in a manner similar to that shown in FIG. 25. As described above, each stage of the shift register 50 receives a part of the four clock signals from the clock signal main lines, a different part of the clock signals from the preceding or succeeding stage, and the remaining part of the clock signals from a second succeeding stage.

Similarly to the first embodiment, the shift register 50 includes the odd-numbered stage shift register and the even-numbered stage shift register, where a stage preceding or succeeding to the odd-numbered stage is an even-numbered stage, and a stage preceding or succeeding to the even-numbered stage is an odd-numbered stage. Further, a second succeeding stage of the odd-numbered stage is an odd-numbered stage, and a second succeeding stage of the even-numbered stage is an even-numbered stage. Therefore, it can be said that each stage of the shift register 50 receives a part of the four clock signals from the clock signal main lines, a different part of the clock signals from the other shift register (more specifically, from a stage provided adjacently in the other shift register), and the remaining part of the clock signals from the same shift register (more specifically, from a succeeding stage of the same shift register).

Further, the line 531 for the first clock CKA of the bistable circuit of the (4k-1)th stage intersects with the line 533 for the third clock CKC of the bistable circuit of the (4k-1)th stage, and with the line 522 for the second clock CKB of the (4k-2)th stage. As described above, the leading lines from the clock signal main lines intersect with the clock lines for receiving the different part of the clock signals from the stage provided adjacently in the other shift register, and with the clock lines for receiving the remaining part of the clock signals from the succeeding stage of the same shift register.

As described above, the gate driver according to this embodiment, each stage of the shift register 50 receives the part of the clock signals from the clock signal main lines, the different part of the clock signals from the adjacently provided stage of the other shift register, and the remaining part of the clock signals from the succeeding stage of the same shift register. From a phase of the clock signal (the first clock CKA) supplied from the clock signal main line to the charge control switching device (the thin film transistor MI), a phase of the different part of the clock signals (the third clock CKC and the fourth clock CKD) is displaced by 90 degrees, and a phase of the remaining part of the clock signals (the second clock CKB) is displaced by 180 degrees. Each stage of the shift register 50 includes a contact (for example, the contact 525) for supplying the clock signal received from the clock signal main line to both the preceding-side and succeeding-side stages of the other shift register.

According to the gate driver of this embodiment and the liquid crystal display device having this gate driver, it is possible to obtain the same effect as that of the first embodiment. From this embodiment, too, the modified examples similarly to those of the first embodiment can be obtained. Further, according to this embodiment, each stage of the shift register 50 may include a contact (for example, the contact 525) for supplying the clock signal received from the clock signal main line to at least two of the preceding-side stage of the other shift register, the succeeding-side stage of the other shift register, and a different stage of the same shift register. Alternatively, each stage of the shift register 50 may separately include a contact for supplying the clock signal received from the clock signal main line to the preceding-side stage of the other shift register, a contact for supplying the same clock signal to the succeeding-side stage of the other shift register, and a contact for supplying the same clock signal to the different stage of the same shift register, and at least two of the three contacts are provided at adjacent positions so as to be in contact with each other, thereby electrically connecting the two adjacent contacts. Further, although each stage of the shift register 50 according to this embodiment receives the remaining part of the clock signals from the succeeding stage of the same shift register, the remaining part of the clock signals may be received from the preceding stage of the same shift register.

It should be noted that while the description has been given taking the liquid crystal display device to which the present invention is applied as an example of the display device, the present invention is not limited to such an example. The present invention can also be applied to a display device such as an organic EL (Electro Luminescence) display device, other than the liquid crystal display device.

INDUSTRIAL APPLICABILITY

A scanning signal line drive circuit according to the present invention provides advantageous effects of reducing a layout area for shift registers, and of reducing a picture-frame area of a panel, and therefore can be applied to various display devices such as liquid crystal display devices and organic EL display devices.

DESCRIPTION OF REFERENCE CHARACTERS

1: Power Supply
2: DC/DC Converter
3: Display Control Circuit
4: Gate Driver (Scanning Signal Line Drive Circuit)
5: Source Driver (Video Signal Line Drive Circuit)
6: Common Electrode Drive Circuit
7: Display Unit
8: Thin Film Transistor
10, 20, 30, 40, 50: Shift Register
11, 12, 31, 41, 51: Bistable Circuit
21, 22, 52 to 54: Dummy Bistable Circuit
GL1 to GLm: Gate Bus Line (Scanning Signal Line)
SL1 to SLn: Source Bus Line (Video Signal Line)
MA, MB, MD, ME, MF, MG, MI, MJ, MK, ML, MN: Thin Film Transistor
GEP_O: First Gate End Pulse Signal
GEP_E: Second Gate End Pulse Signal
GSP_O: First Gate Start Pulse Signal
GSP_E: Second Gate Start Pulse Signal
GCK: Gate Clock Signal
CK1: First Gate Clock Signal
CK1B: Second Gate Clock Signal
CK2: Third Gate Clock Signal
CK2B: Fourth Gate Clock Signal
CKA: First Clock
CKB: Second Clock
CKC: Third Clock
CKD: Fourth Clock
S: Set Signal
R: Reset Signal
Q: State Signal

The invention claimed is:

1. A scanning signal line drive circuit capable of driving a plurality of scanning signal lines provided on a display unit of a display device, the scanning signal line drive circuit comprising:
a plurality of shift registers each including a plurality of stages, and configured to sequentially shift a pulse supplied to a first stage based on a plurality of clock signals supplied to each stage to drive the scanning signal lines; and
clock signal main lines including a plurality of signal lines configured to respectively transmit the clock signals, and provided on an opposite side of the display unit with respect to the shift registers, wherein
the plurality of shift registers is disposed on one side of the display unit,
the plurality of shift registers includes an odd-numbered stage shift register constituted only by odd-numbered stages and an even-numbered stage shift register constituted only by even-numbered stages, and
each stage of one of the shift registers is configured to receive a part of the clock signals from the clock signal main line, and a remaining part of the clock signals from both an adjacently provided preceding stage and an adjacently provided succeeding stage of another one of the shift registers.

2. The scanning signal line drive circuit according to claim 1, wherein
each stage of the one of the shift registers is configured to operate based on four clock signals.

3. The scanning signal line drive circuit according to claim 1, wherein
each stage of the one of the shift registers includes a charge control switching device configured to charge a corresponding one of the scanning signal lines based on the clock signal received from the clock signal main line, and
a phase of the remaining part of the clock signals is displaced by 90 degrees from a phase of the clock signal supplied to the charge control switching device.

4. The scanning signal line drive circuit according to claim 3, wherein
each stage of the one of the shift registers further includes a thin film transistor having a drain or source terminal connected to a gate terminal of the charge control switching device, the thin film transistor being a multi-channel thin film transistor formed using oxide semiconductor.

5. The scanning signal line drive circuit according to claim 1, wherein
each stage of the one of the shift registers includes a contact for supplying the part of the clock signals to both of a preceding-side and a succeeding-side stage of the another shift register.

6. The scanning signal line drive circuit according to claim 1, wherein
each stage of the one of the shift registers includes a contact for supplying the part of the clock signals to a preceding-side stage of the another shift register and a contact for supplying the part of the clock signals to a succeeding-side stage of the another shift register, the two contacts being provided at positions adjacent to each other.

7. The scanning signal line drive circuit according to claim 1, wherein
the plurality of the shift registers include a shift register having a dummy stage configured to supply the clock signal received from the clock signal main line to the first stage without change, and a shift register having a dummy stage configured to supply the clock signal received from the clock signal main line to a last stage without change.

8. The scanning signal line drive circuit according to claim 7, wherein
the dummy stage is configured only by a component necessary for transmitting the clock signal received from the clock signal main line, out of components of each stage of the shift register.

9. A display device comprising:
a display unit including a plurality of scanning signal lines; and
the scanning signal line drive circuit according to claim 1.

* * * * *